(12) United States Patent
Tan et al.

(10) Patent No.: US 11,177,301 B2
(45) Date of Patent: Nov. 16, 2021

(54) RELIABLE SEMICONDUCTOR PACKAGES

(71) Applicant: UTAC Headquarters Pte. Ltd., Singapore (SG)

(72) Inventors: Hua Hong Tan, Singapore (SG); Chee Kay Chow, Singapore (SG); Thian Hwee Tan, Singapore (SG); Wedanni Linsangan Micla, Singapore (SG); Enrique Jr Sarile, Singapore (SG); Mario Arwin Fabian, Singapore (SG); Dennis Tresnado, Singapore (SG); Antonino Ii Milanes, Singapore (SG); Ming Koon Ang, Singapore (SG); Kian Soo Lim, Singapore (SG); Mauro Jr. Dionisio, Singapore (SG); Teddy Joaquin Carreon, Singapore (SG)

(73) Assignee: UTAC Headquarters Pte. Ltd., Singapore (SG)

(*) Notice: Subject to any disclaimer, the term of this patent is extended or adjusted under 35 U.S.C. 154(b) by 7 days.

(21) Appl. No.: 16/687,659

(22) Filed: Nov. 18, 2019

(65) Prior Publication Data
US 2020/0161351 A1 May 21, 2020

Related U.S. Application Data

(60) Provisional application No. 62/768,990, filed on Nov. 19, 2018.

(51) Int. Cl.
*H01L 27/14* (2006.01)
*H01L 27/146* (2006.01)

(52) U.S. Cl.
CPC .. *H01L 27/14618* (2013.01); *H01L 27/14636* (2013.01); *H01L 27/14683* (2013.01)

(58) Field of Classification Search
CPC . H01L 23/5389; H01L 23/5385; H01L 21/56; H01L 21/561; H01L 21/565;
(Continued)

(56) References Cited

U.S. PATENT DOCUMENTS 7,745,897 B2   6/2010   Tan et al.
8,969,120 B2   3/2015   Huang et al.
(Continued)

FOREIGN PATENT DOCUMENTS

TW   I248665 B   2/2006

*Primary Examiner* — Moin M Rahman
(74) *Attorney, Agent, or Firm* — Horizon IP Pte Ltd.

(57) ABSTRACT

A method for forming a semiconductor package is disclosed. The method includes providing a package substrate having top and bottom major package substrate surfaces, the top major package surface including a die attach region. A die having first and second major die surfaces is attached onto the die attach region. The second major die surface is attached to the die attach region. The first major die surface includes an die active region and a cover adhesive region surrounding the die active region. The method also includes applying a cover adhesive to the cover adhesive region on the first major die surface. A protective cover with first and second major cover surfaces and side surfaces is attached to the die using the cover adhesive. The second major cover surface contacts the cover adhesive. The protective cover covers the die active region. The protective cover includes a discontinuity on at least one of the side surfaces. An encapsulant is disposed on the package substrate to cover exposed portions of the package substrate, die and bond wires and side surfaces of the protective cover, while leaving the first major cover surface exposed. The discontinuity enhances adhesion of the encapsulant to the protective cover.

20 Claims, 22 Drawing Sheets

(58) Field of Classification Search
CPC ... H01L 25/16; H01L 24/19; H01L 21/76802; H01L 21/31053; H01L 25/50; H01L 21/6835; H01L 24/24; H01L 25/0655; H01L 21/568; H01L 2224/73267; H01L 2221/68318; H01L 2221/68381; H01L 2224/16265; H01L 23/3128; H01L 23/5383; H01L 2221/68372; H01L 23/49816; H01L 2224/0401; H01L 2224/04105; H01L 2224/83005; H01L 224/12105; H01L 2224/16145; H01L 2224/16227; H01L 2224/24195; H01L 2224/32145; H01L 2224/32225; H01L 2224/73204; H01L 2224/73259; H01L 2224/81005; H01L 2224/92125; H01L 2924/15311; H01L 2924/18161; H01L 2924/18162; H01L 2924/19041; H01L 2924/19042; H01L 2924/19043; H01L 2924/19102; H01L 2224/92224; H01L 2924/19104; H01L 2221/68359; H01L 2224/24137; H01L 2224/0603; H01L 2224/06181; H01L 24/06; H01L 24/13; H01L 2224/81815; H01L 2224/13101; H01L 24/73; H01L 24/16; H01L 24/81; H01L 24/92; H01L 2224/82001; H01L 24/82; H01L 24/20; H01L 25/06252; H01L 21/76885; H01L 24/97; H01L 25/105; H01L 23/3218; H01L 25/0657; H01L 2224/1703; H01L 24/17; H01L 24/94; H01L 2221/68345; H01L 2224/05124; H01L 2224/05147; H01L 2224/32245; H01L 2224/82005; H01L 2225/06517; H01L 2225/06527; H01L 2225/06548; H01L 2225/06572; H01L 2225/06586; H01L 2225/06589; H01L 2924/01013; H01L 2924/01029; H01L 2924/01074; H01L 2924/1431; H01L 2924/1436; H01L 2924/1437; H01L 2924/1438; H01L 23/36; H01L 23/49827; H01L 2225/1041; H01L 2224/12105; H01L 2224/73253; H01L 2224/83191; H01L 2224/92225; H01L 2224/92244; H01L 2224/97; H01L 2225/1035; H01L 2225/1058; H01L 2224/02379; H01L 224/02372; H01L 2224/0231; H01L 2224/8385; H01L 23/4012; H01L 2225/06541; H01L 23/5226; H01L 24/76; H01L 23/498–49894; H01L 23/538–5389; H01L 21/4846–4867; H01L 21/4807–481
See application file for complete search history.

(56) References Cited

U.S. PATENT DOCUMENTS

| | | | |
|---|---|---|---|
| 2006/0081967 A1* | 4/2006 | Ha | H01L 25/105 257/676 |
| 2009/0072377 A1* | 3/2009 | Park | H01L 23/3164 257/690 |

* cited by examiner

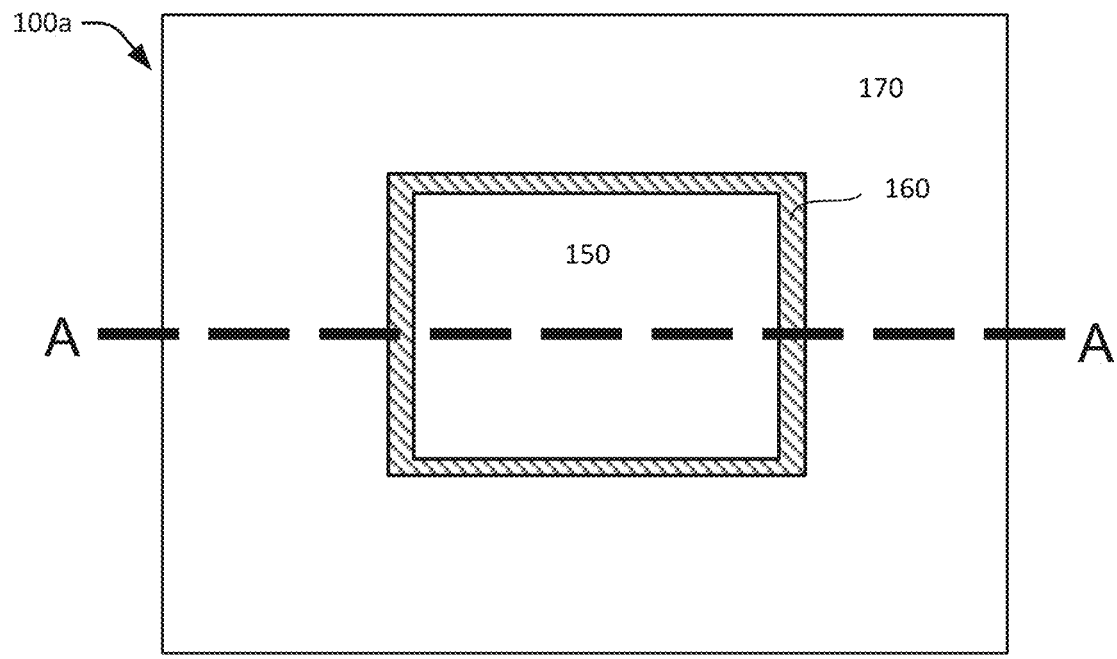
Fig. 1a$_i$
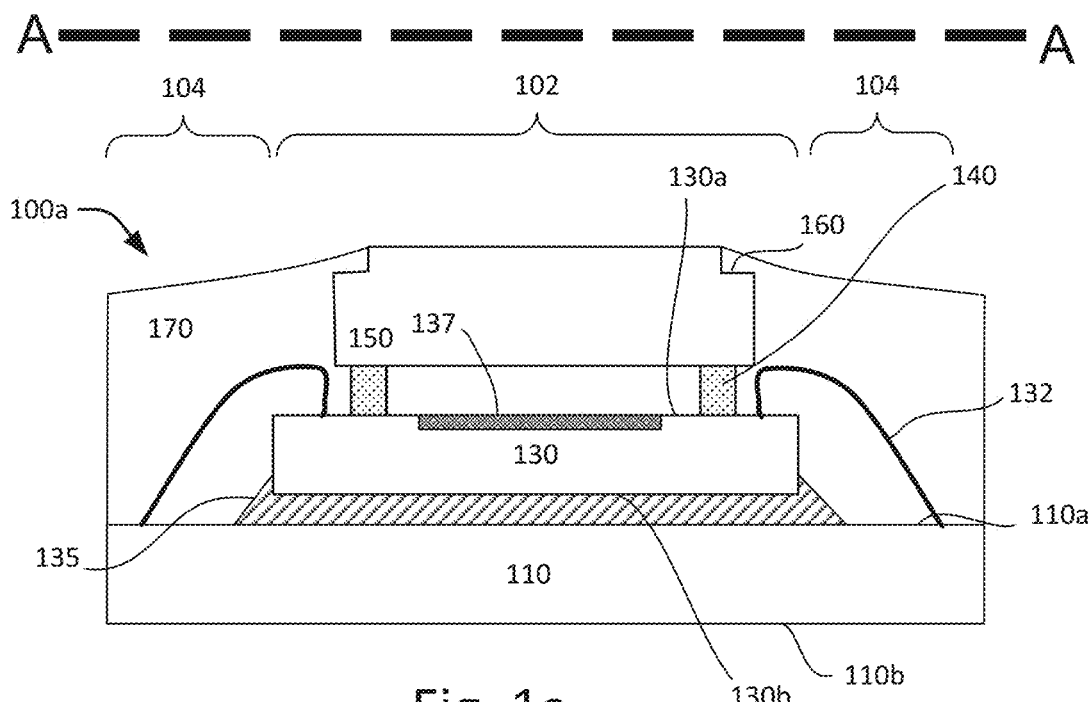
Fig. 1a$_{ii}$

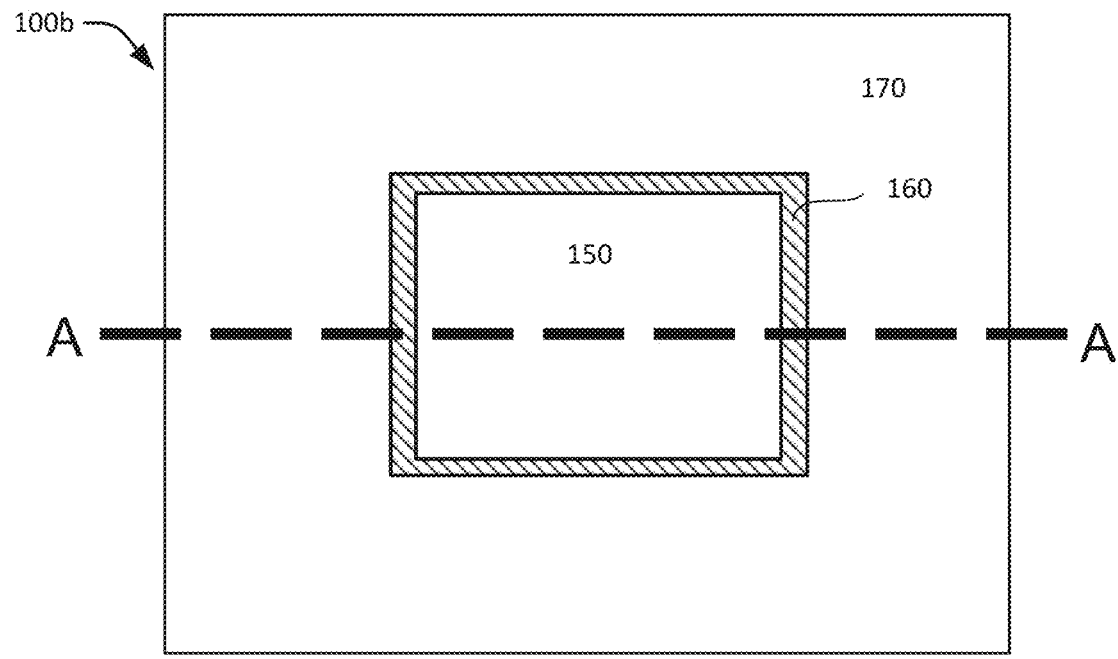
Fig. 1b$_i$
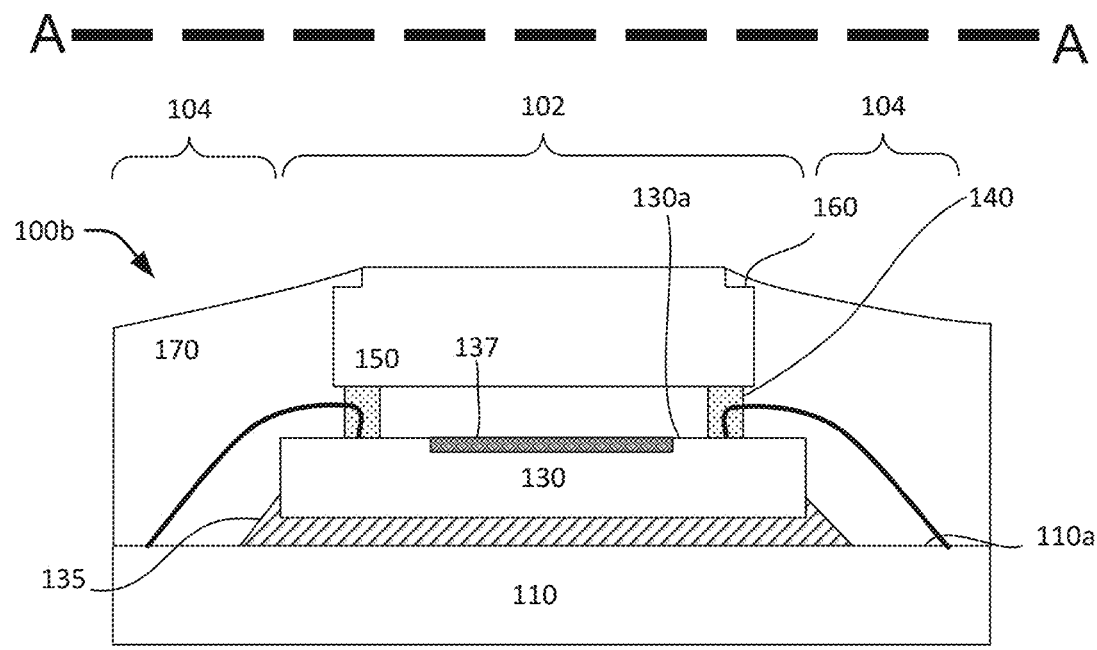
Fig. 1b$_{ii}$

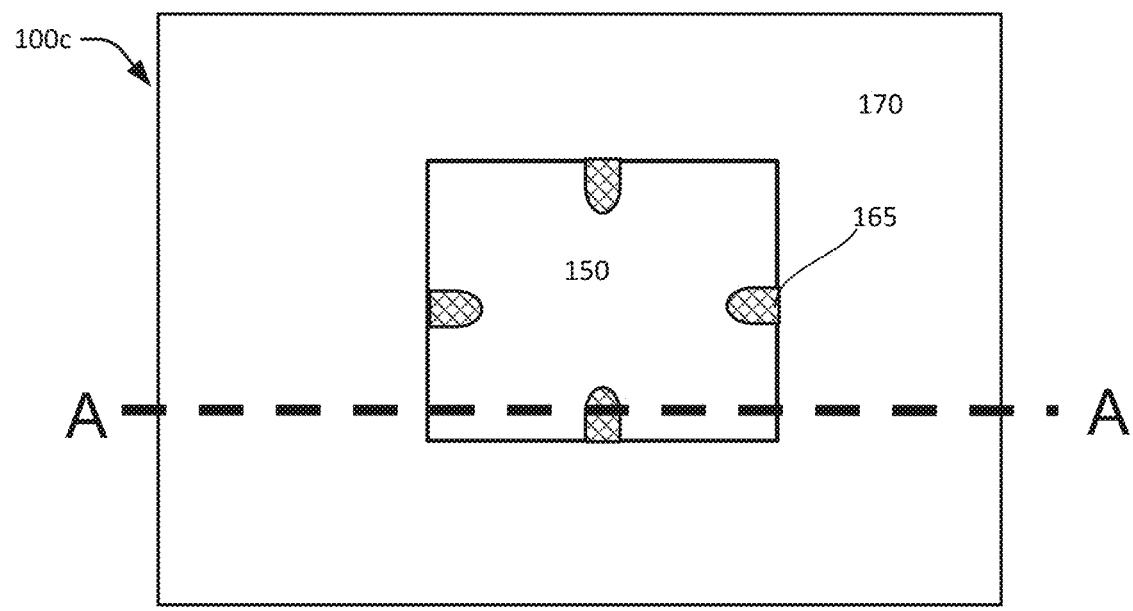
Fig. 1c$_i$
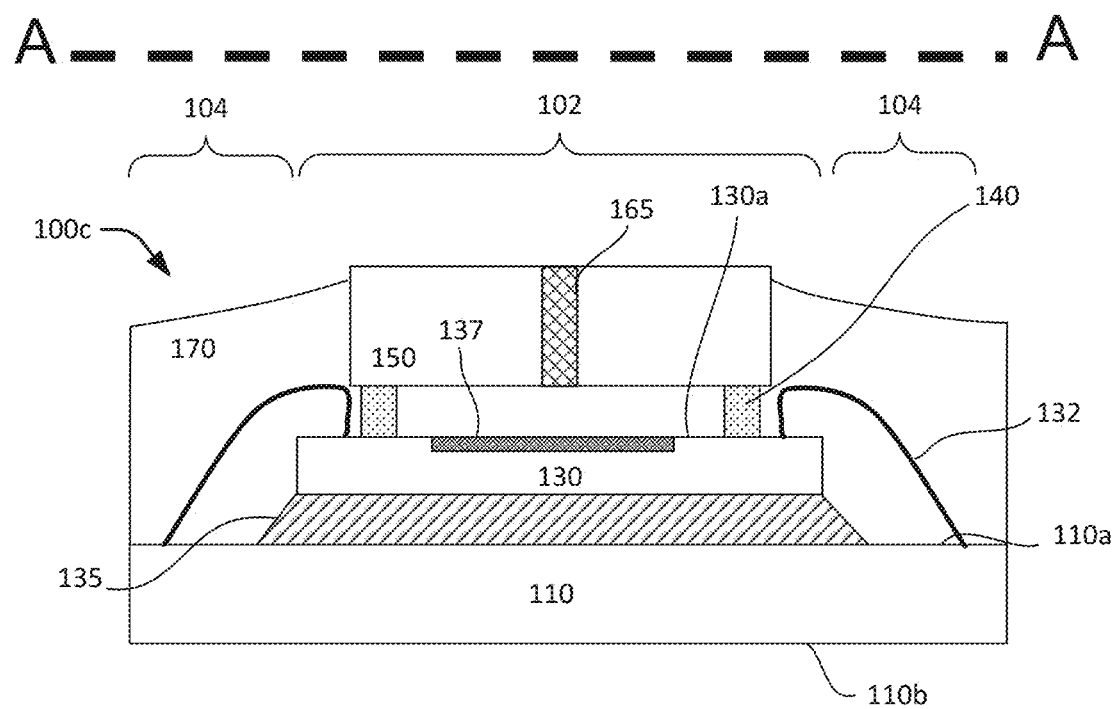
Fig. 1c$_{ii}$

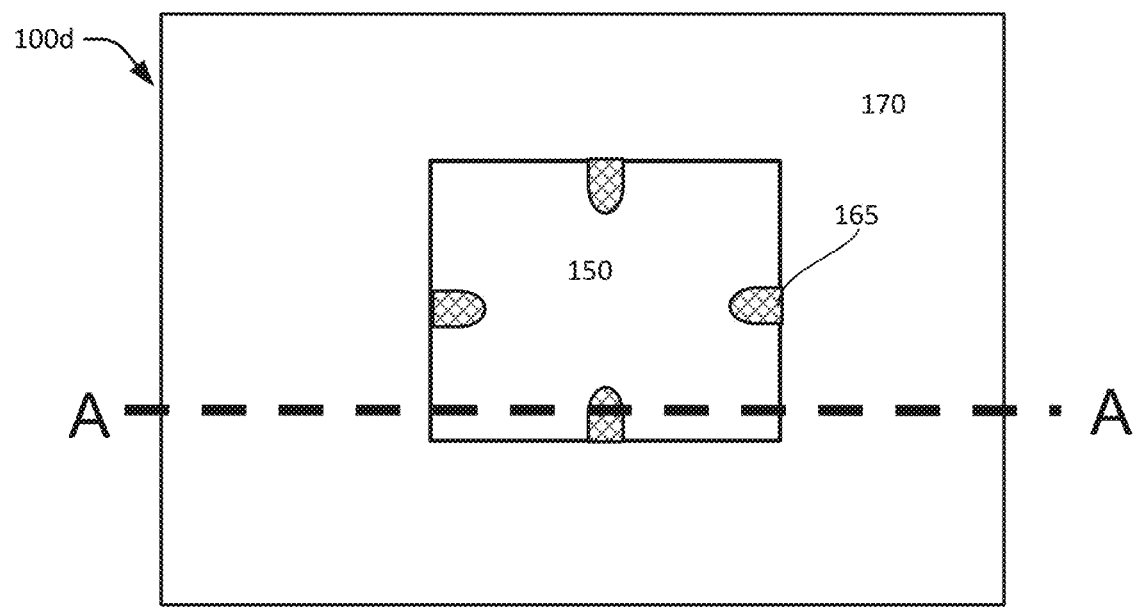
Fig. 1d$_i$
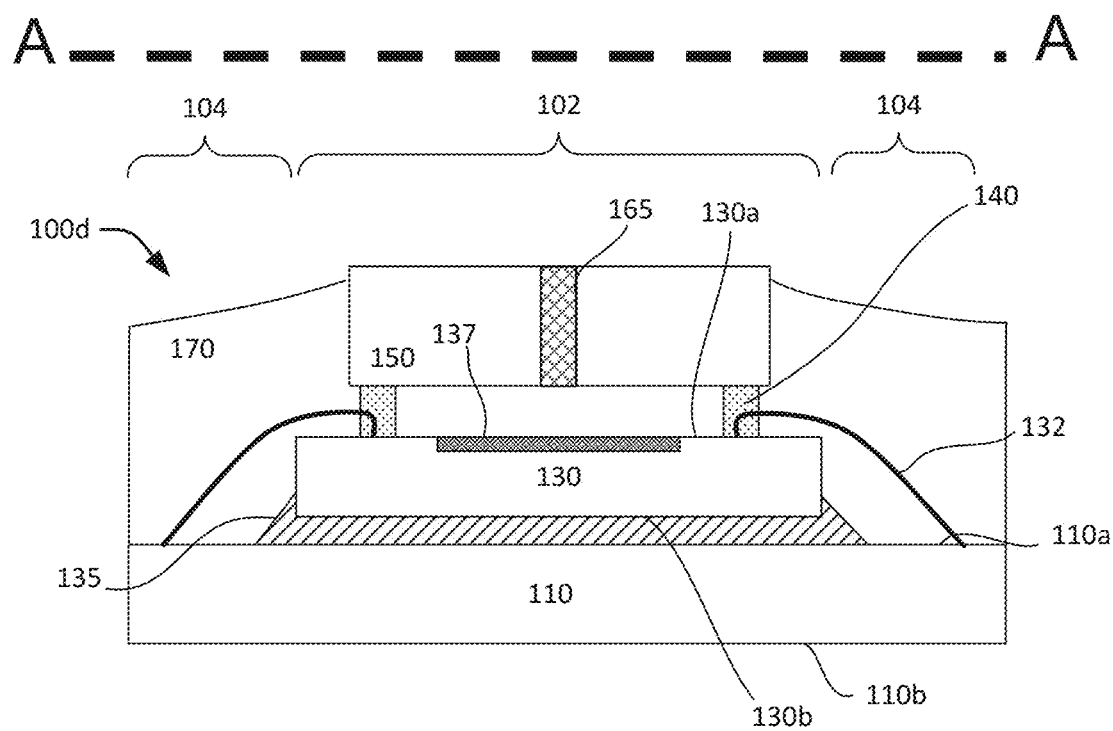
Fig. 1d$_{ii}$

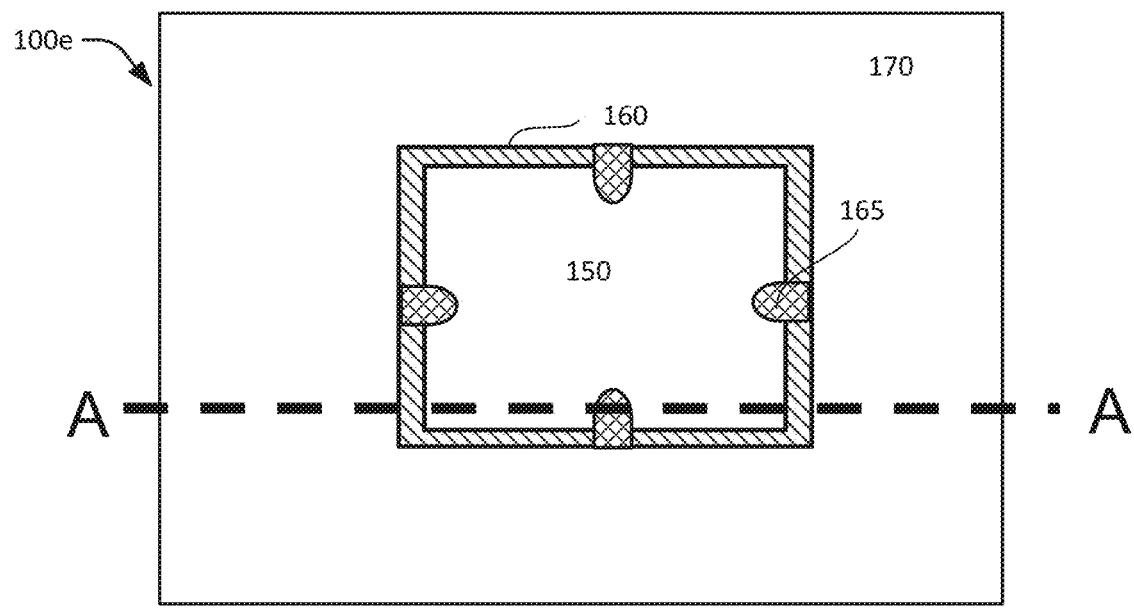
Fig. 1e_i
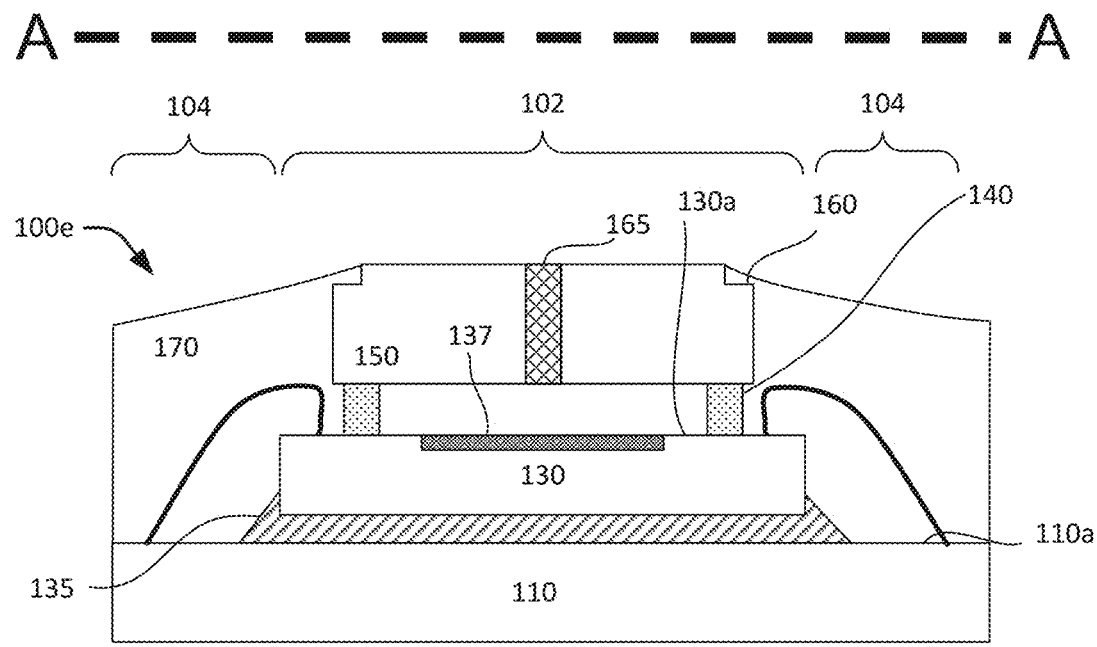
Fig. 1e_ii

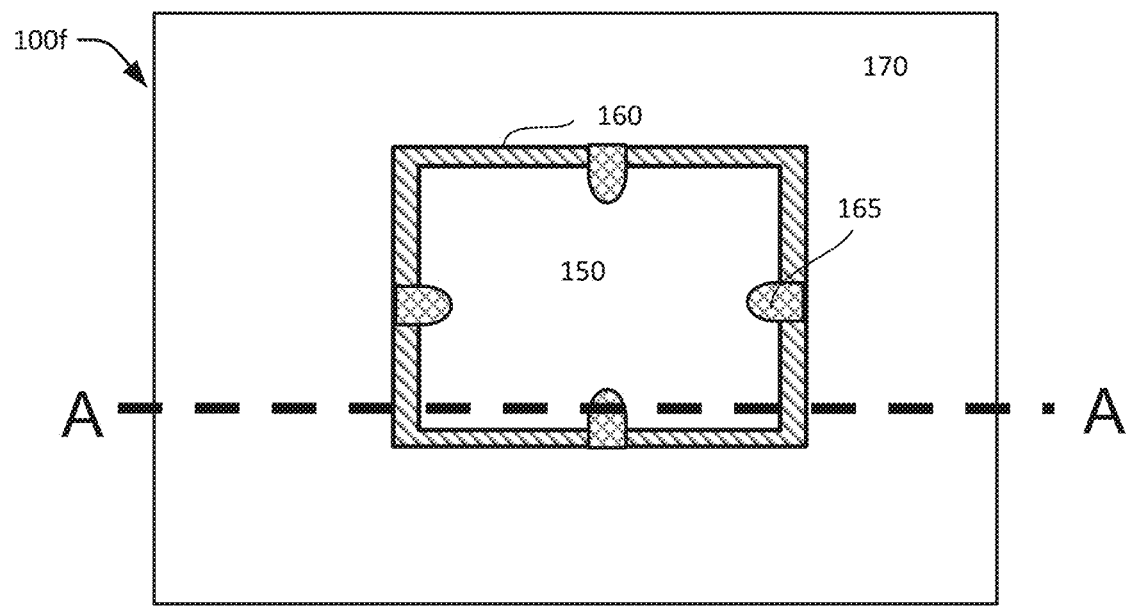
Fig. 1f$_i$
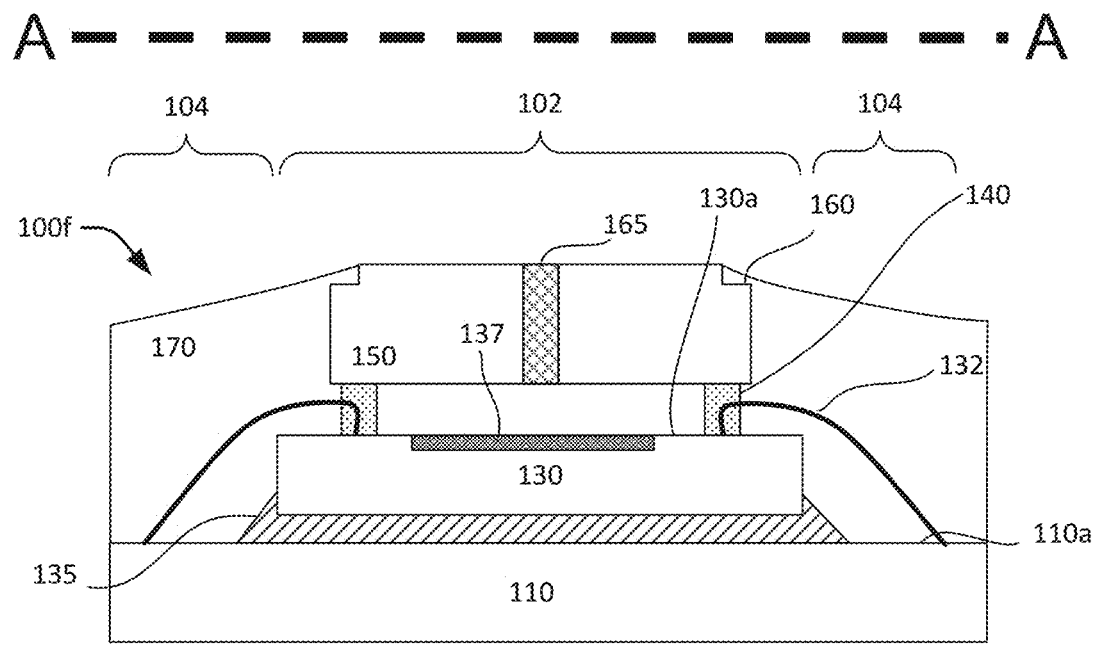
Fig. 1f$_{ii}$

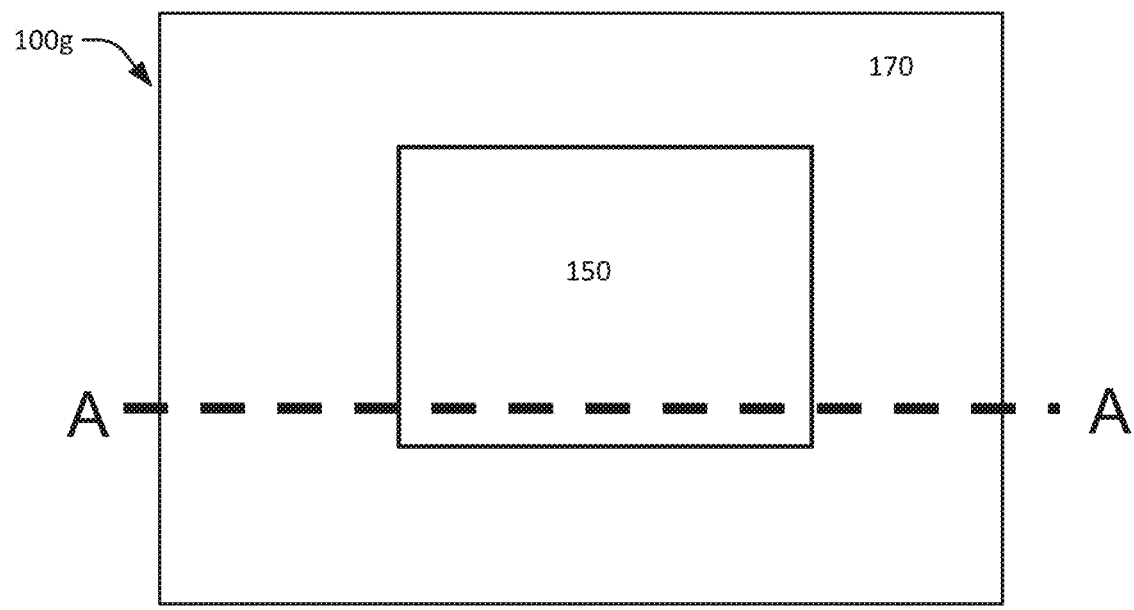
Fig. 1g$_i$
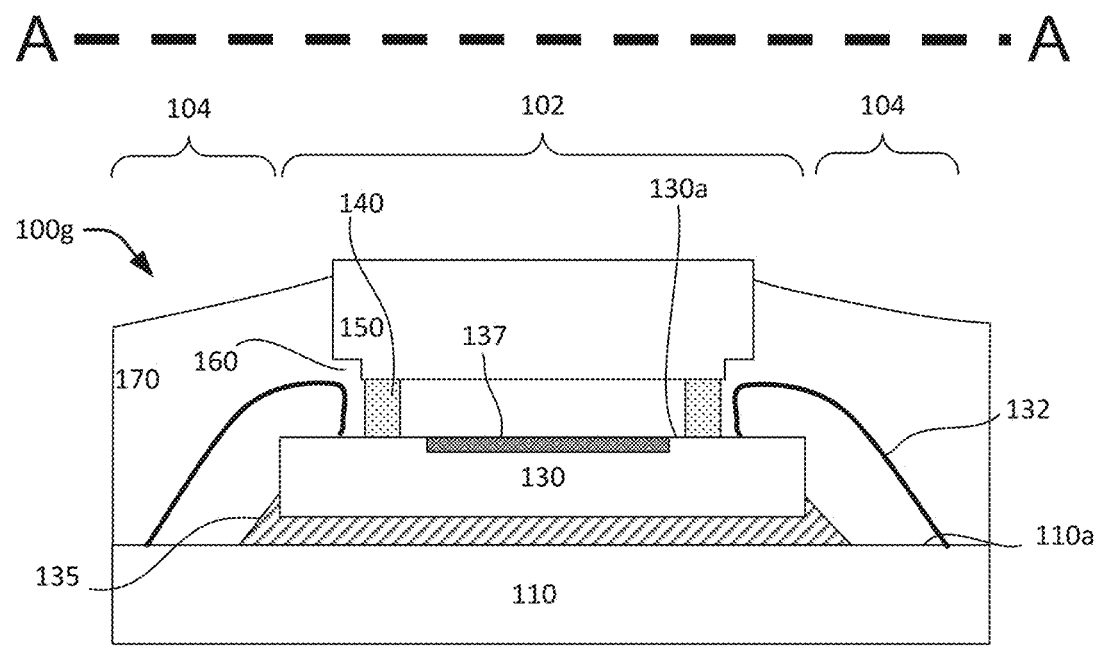
Fig. 1g$_{ii}$

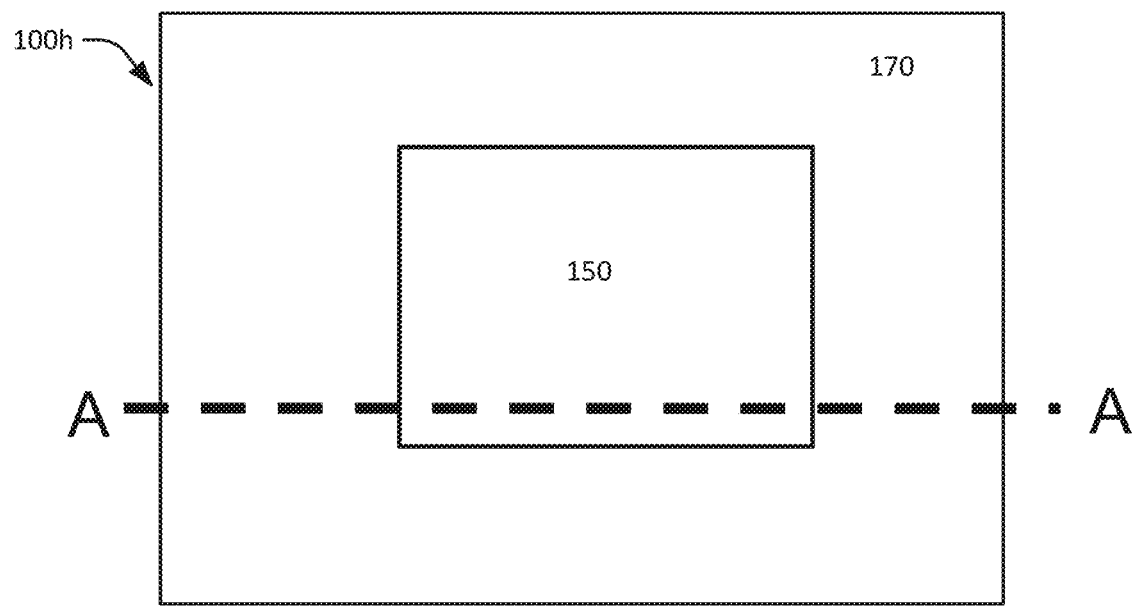
Fig. 1h$_i$
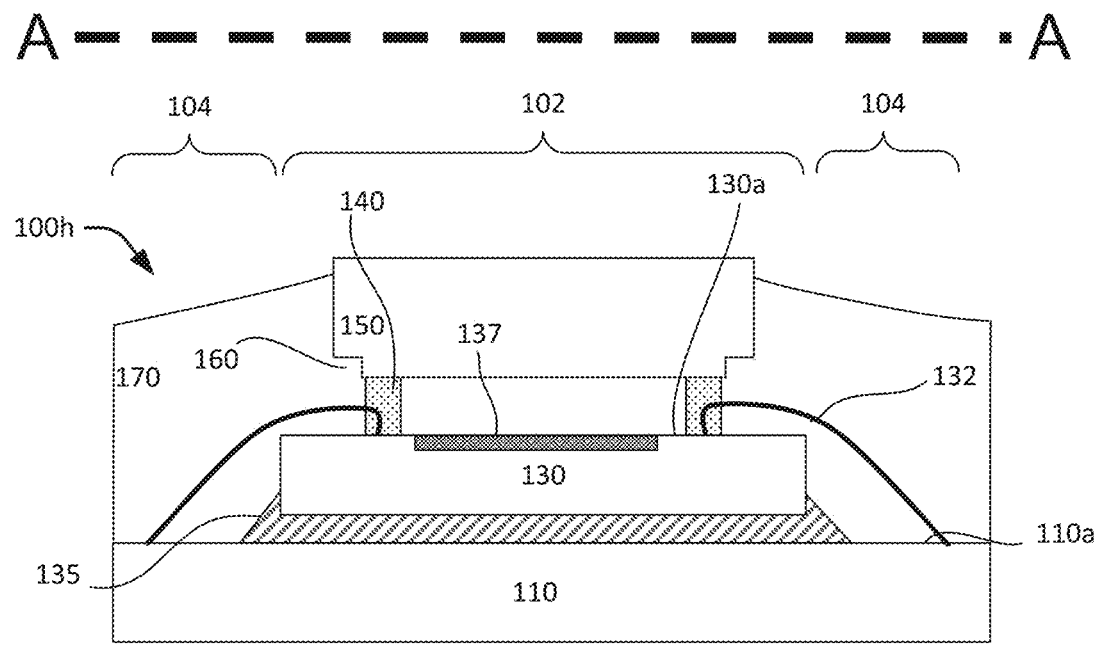
Fig. 1h$_{ii}$

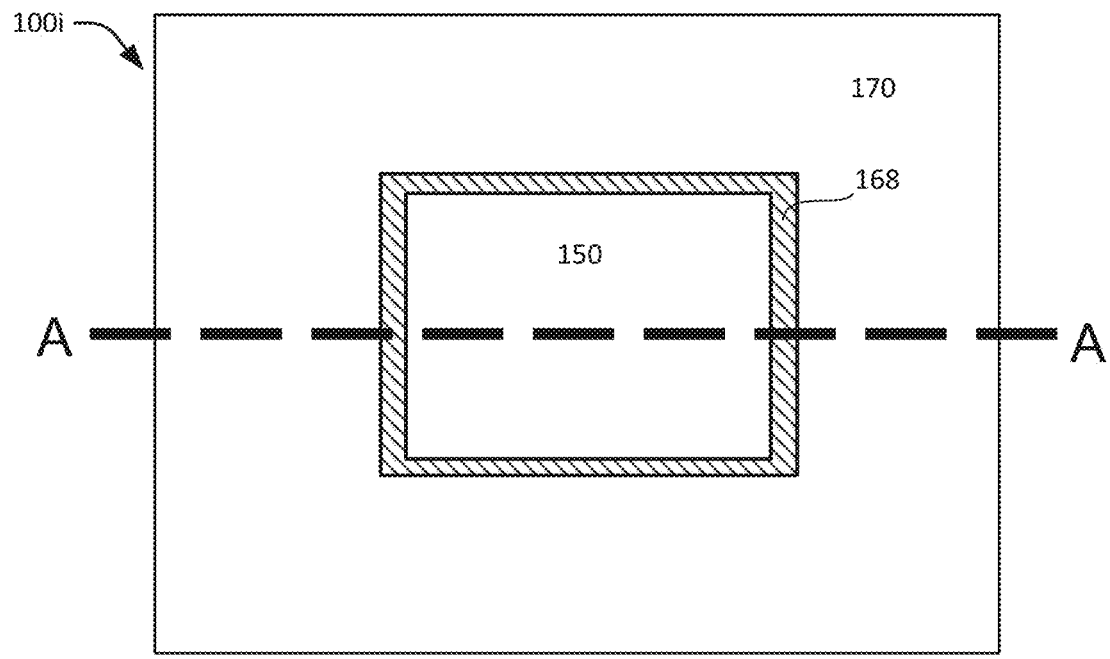
Fig. 1i_i
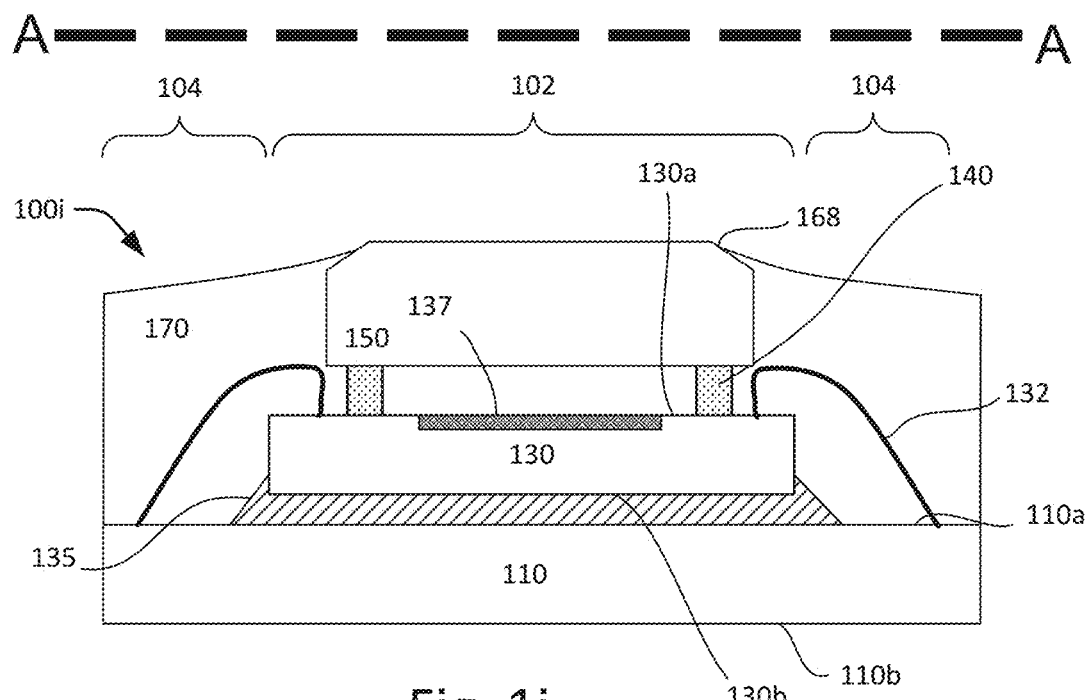
Fig. 1i_ii

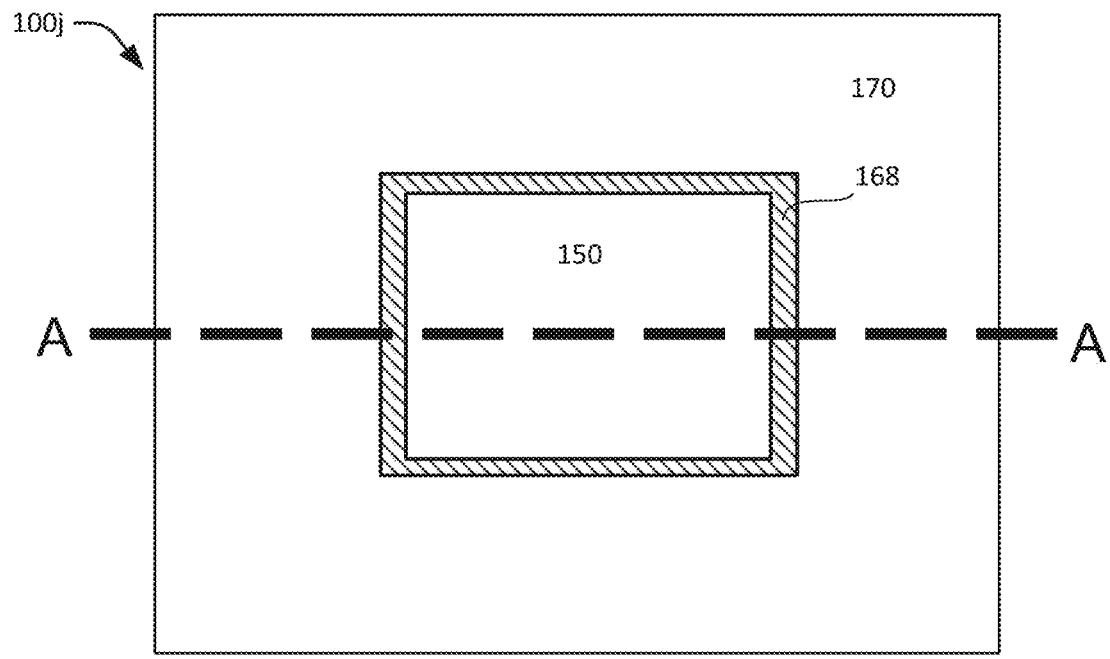
Fig. 1j$_i$
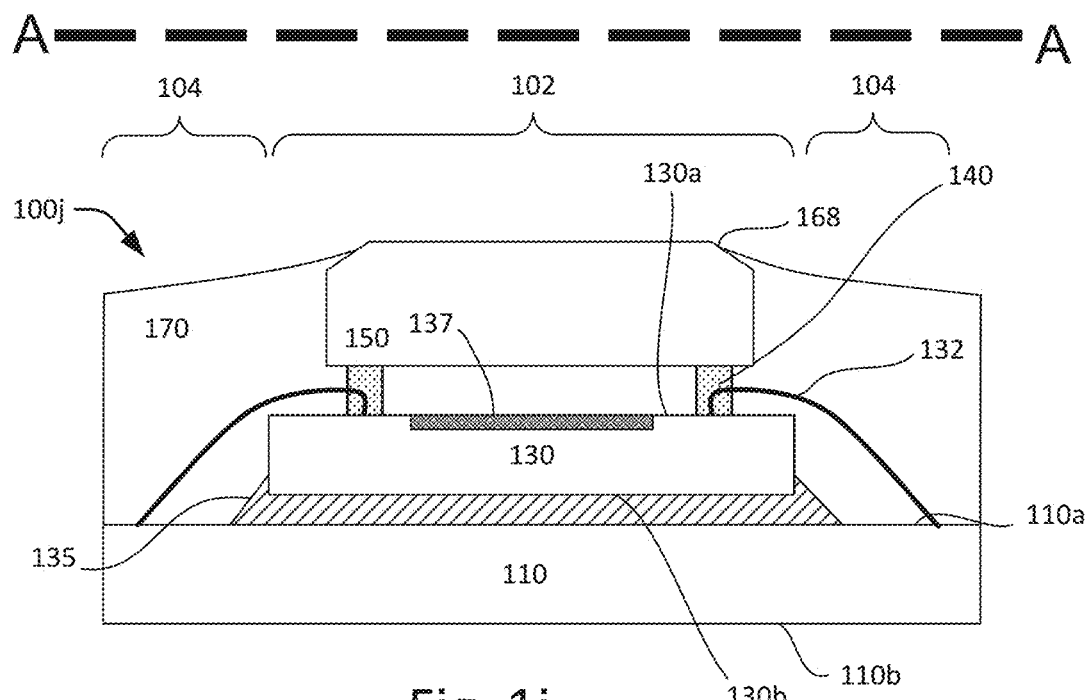
Fig. 1j$_{ii}$

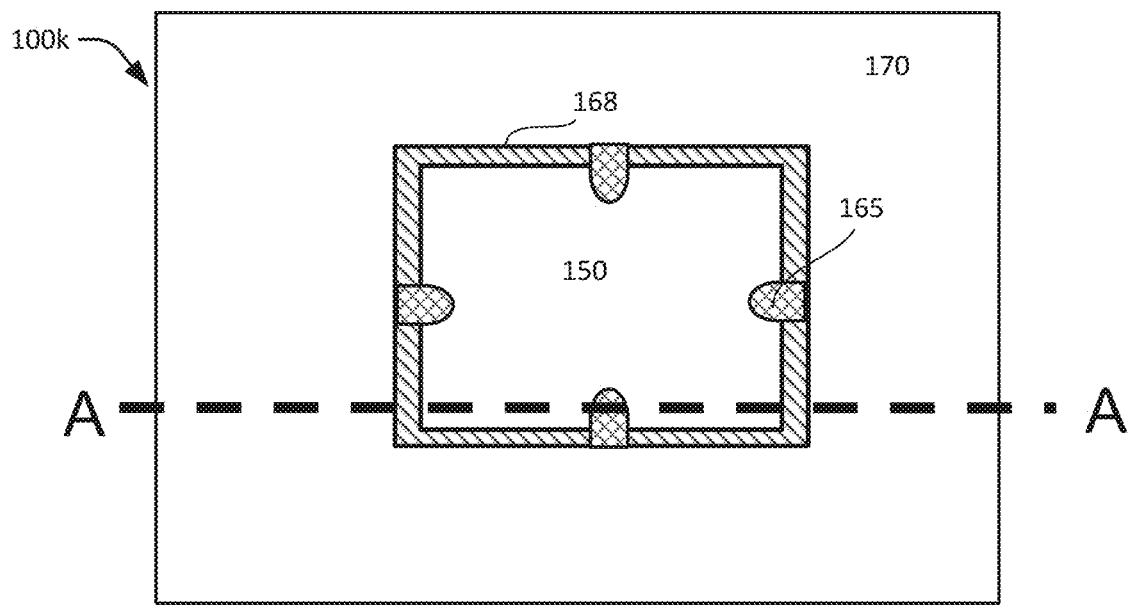
Fig. 1k$_i$
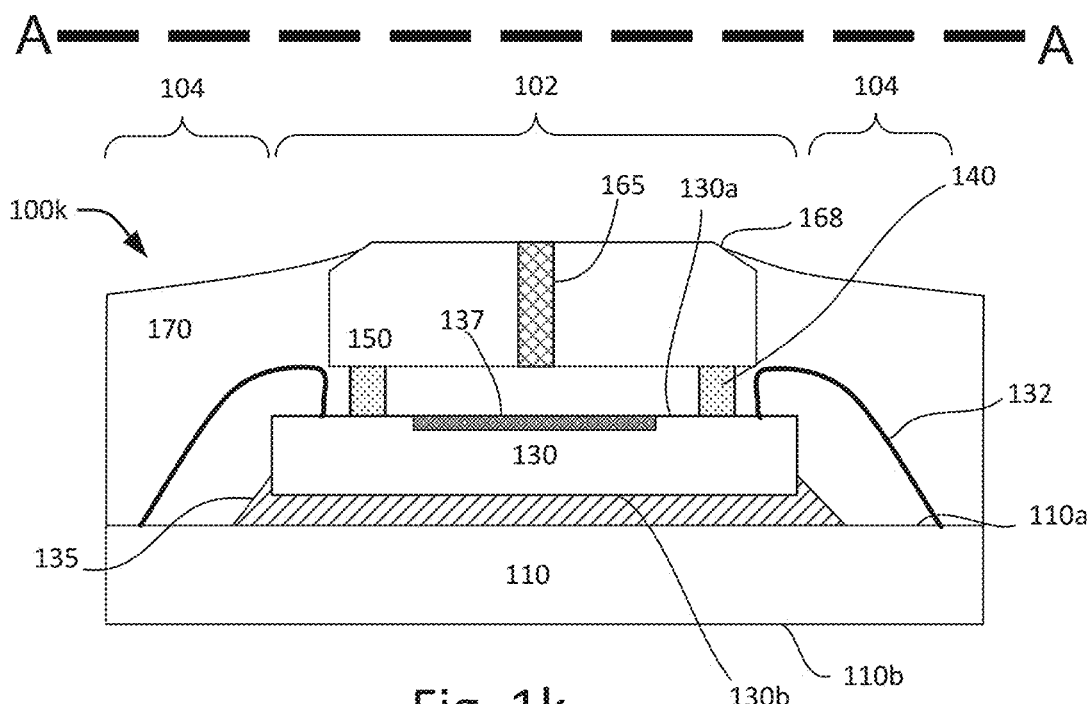
Fig. 1k$_{ii}$

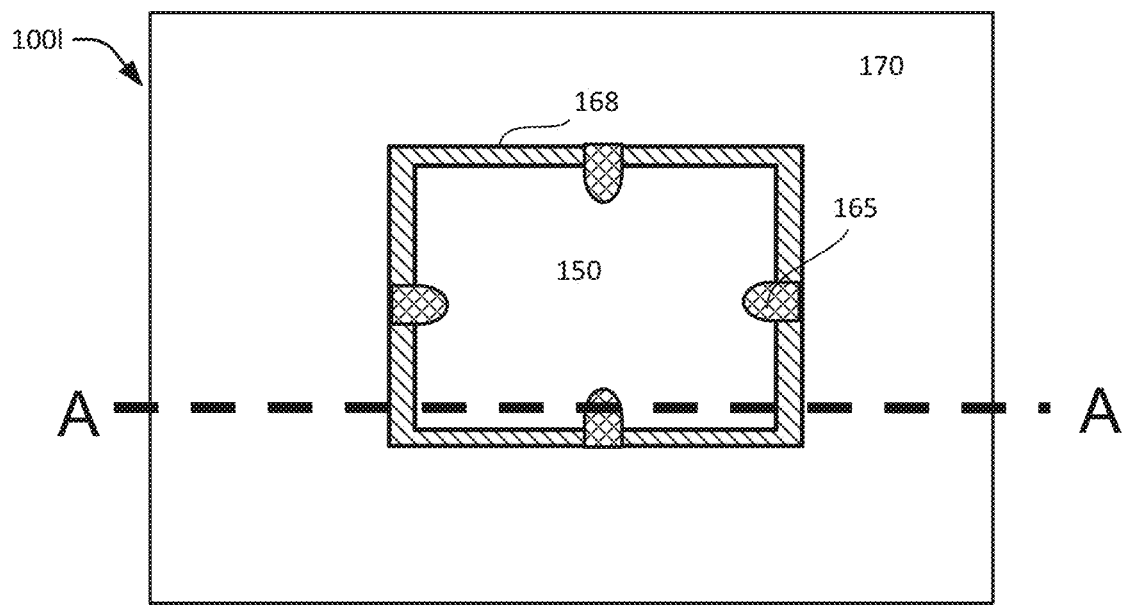
Fig. 1I$_i$
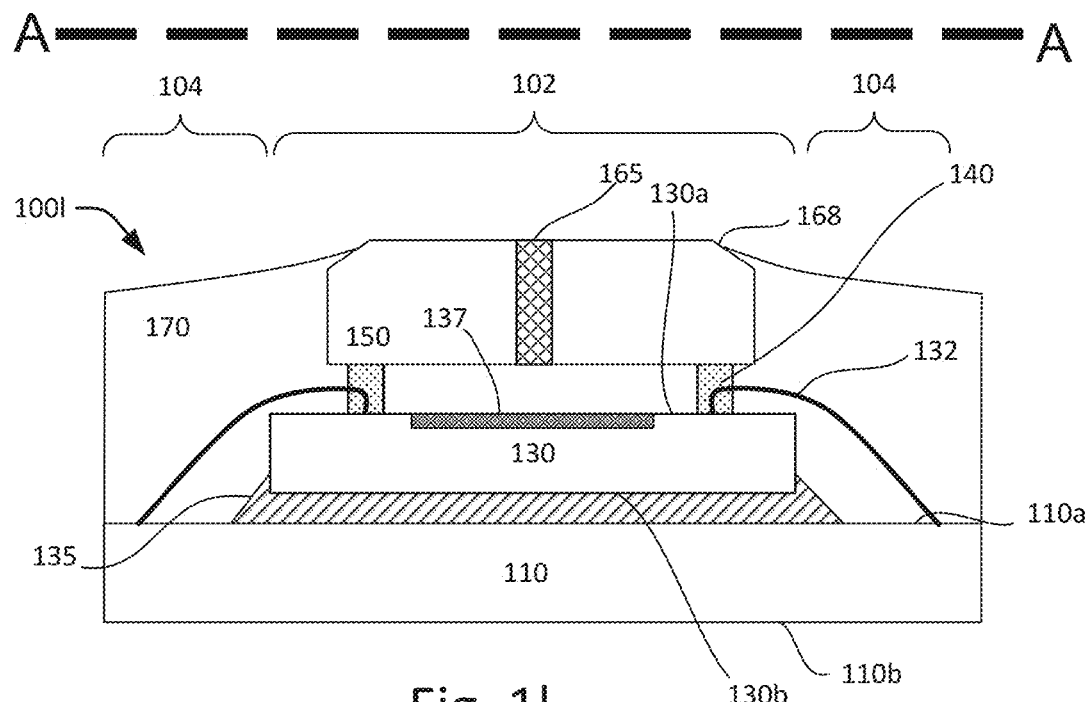
Fig. 1I$_{ii}$

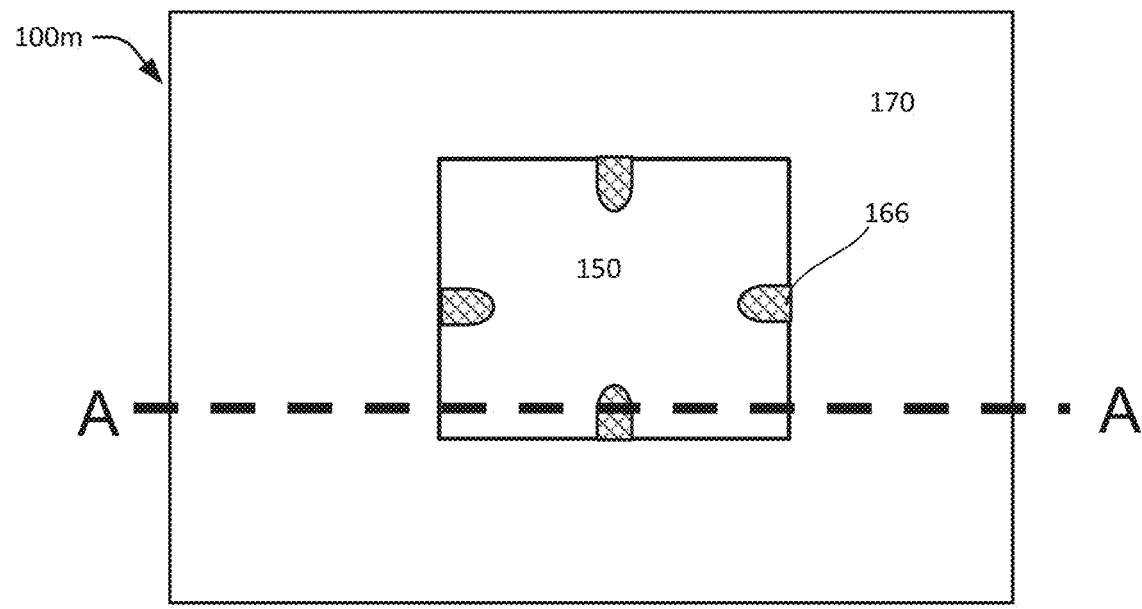
Fig. 1m$_i$
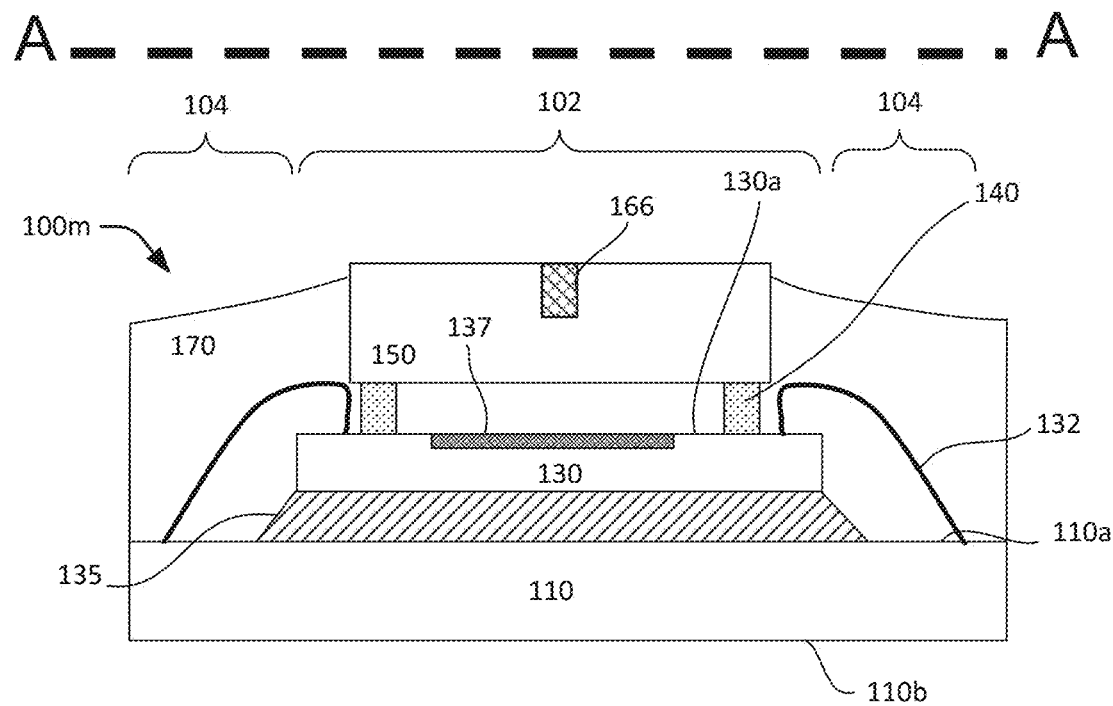
Fig. 1m$_{ii}$

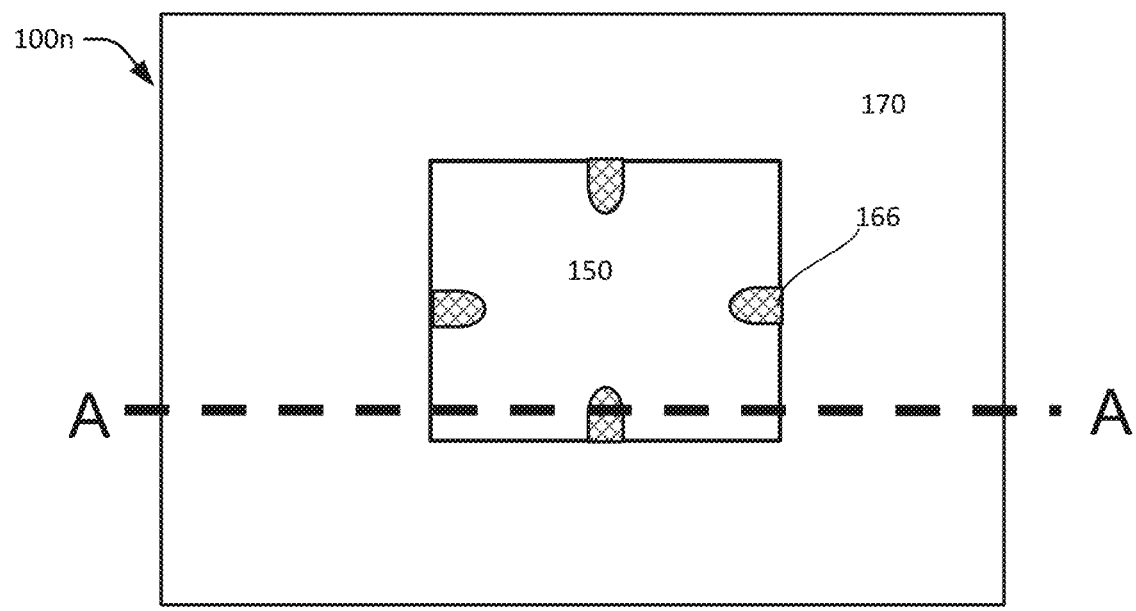
Fig. 1n$_i$
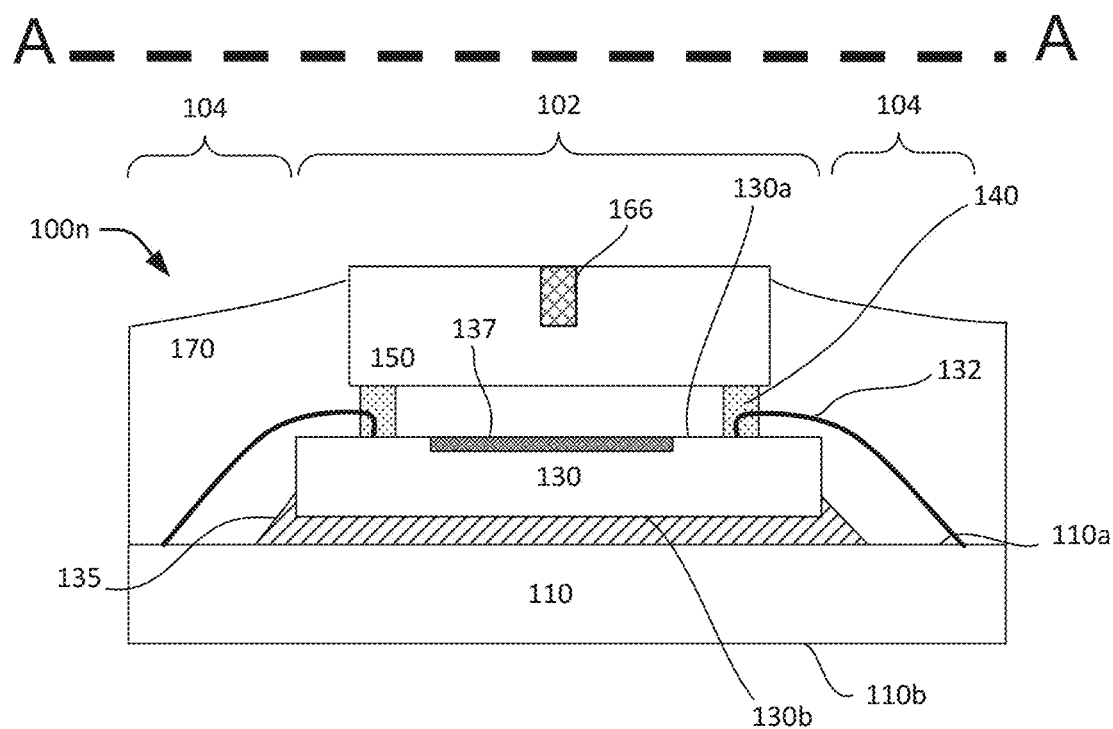
Fig. 1n$_{ii}$

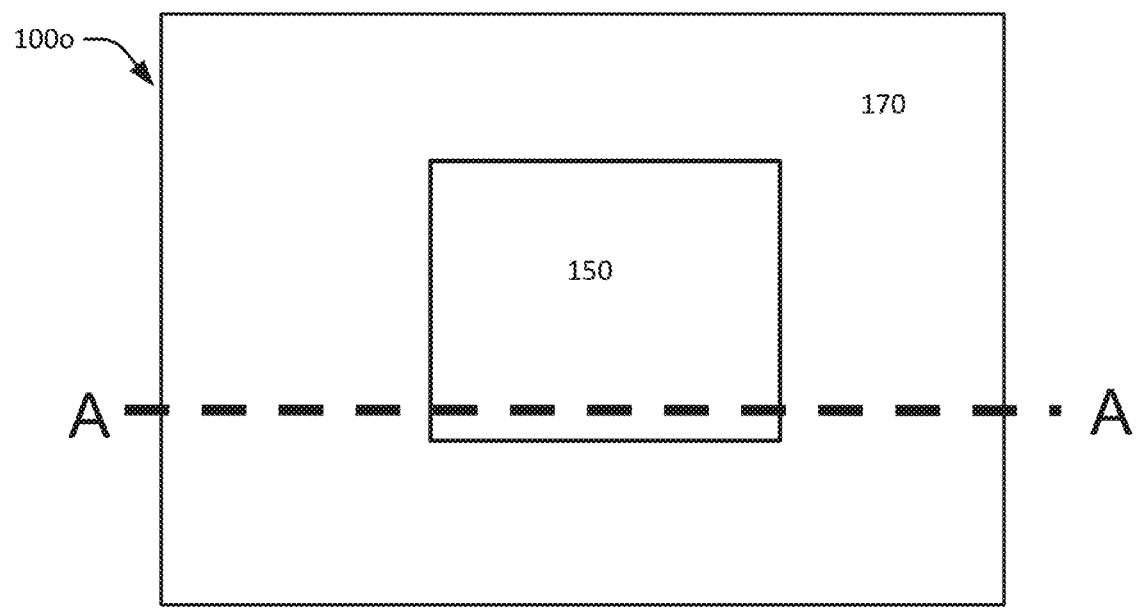
Fig. 1o_i
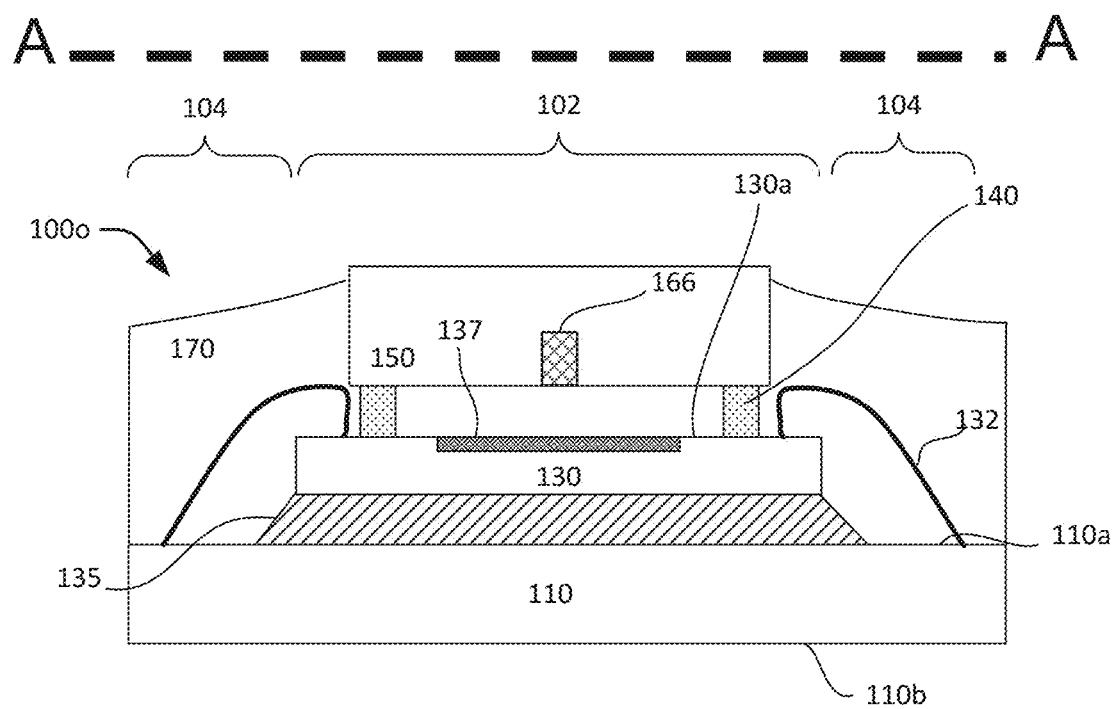
Fig. 1o_ii

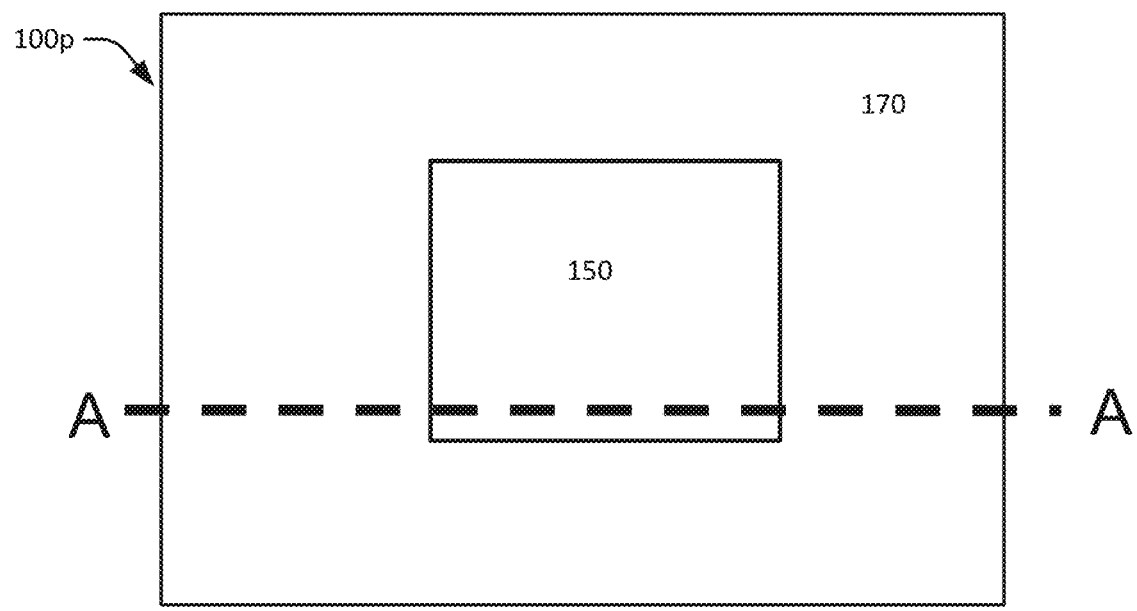
Fig. 1p$_i$
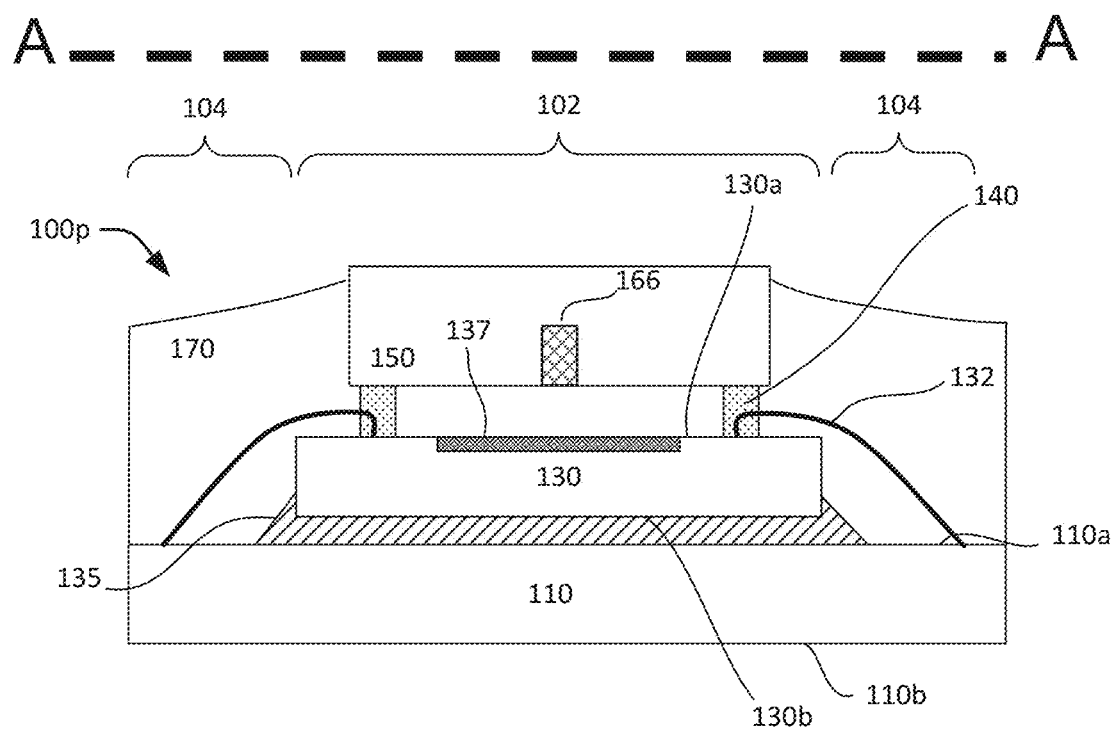
Fig. 1p$_{ii}$

RELIABLE SEMICONDUCTOR PACKAGES

CROSS-REFERENCE TO RELATED APPLICATION

This application claims the benefit of U.S. Provisional Application No. 62/768,990, filed on Nov. 19, 2018, which is incorporated herein by reference in its entirety for all purposes.

FIELD OF THE INVENTION

The present disclosure relates to semiconductor packages and the manufacturing method of such packages. In particular, the present disclosure relates to semiconductor packages for sensor chips. More specifically, the present disclosure relates to semiconductor packages for image sensor chips.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a transparent cover is provided over the sensor area of the image sensor die. The cover permits light to reach the optically active area of the die while also providing protection for the die from the environment. An adhesive may be employed to attach the cover to the die. An encapsulant is provided over the die and on the side edges of the transparent cover. However, conventional sensor dies suffer from delamination of the cover, which negatively impacts package reliability.

From the foregoing discussion, there is a desire to provide improved adhesion of the encapsulant to the cover of the die, seal strength of the cover to the package and reduced effect of delamination between the cover and adhesive, which in turn improves reliability of semiconductor packages.

SUMMARY

Embodiments generally relate to semiconductor packages and methods for forming semiconductor packages.

In one embodiment, a method for forming a semiconductor package is disclosed. The method includes providing a package substrate having top and bottom major package substrate surfaces, the top major package surface including a die attach region. A die having first and second major die surfaces is attached onto the die attach region. The second major die surface is attached to the die attach region. The first major die surface includes an die active region and a cover adhesive region surrounding the die active region. The method also includes applying a cover adhesive to the cover adhesive region on the first major die surface. A protective cover with first and second major cover surfaces and side surfaces is attached to the die using the cover adhesive. The second major cover surface contacts the cover adhesive. The protective cover covers the die active region. The protective cover includes a discontinuity on at least one of the side surfaces. An encapsulant is disposed on the package substrate to cover exposed portions of the package substrate, die and bond wires and side surfaces of the protective cover, while leaving the first major cover surface exposed. The discontinuity enhances adhesion of the encapsulant to the protective cover.

In another embodiment, a method for forming a semiconductor package is disclosed. The method includes providing a package substrate having top and bottom major package substrate surfaces, the top major package surface including a die attach region. A die having first and second major die surfaces is attached onto the die attach region. The second major die surface is attached to the die attach region. The first major die surface includes an die active region and a cover adhesive region surrounding the die active region. The method also includes applying a cover adhesive to the cover adhesive region on the first major die surface. A protective cover with first and second major cover surfaces and side surfaces is attached to the die using the cover adhesive. The second major cover surface contacts the cover adhesive. The protective cover covers the die active region. The protective cover includes a discontinuity on at least one of the side surfaces.

In yet another embodiment, the semiconductor package includes a package substrate having top and bottom major package substrate surfaces. The top major package surface includes a die attach region and a die disposed on the die attach region. The die includes first and second major die surfaces, the second major die surface being attached to the die attach region, the first major die surface including an die active region and a cover adhesive region surrounding the die active region. The semiconductor package also includes a cover adhesive disposed on the cover adhesive region on the first major die surface. A protective cover having first and second major cover surfaces and side surfaces is also included. The second major cover surface is attached to the die by the cover adhesive. The protective cover covers the die active region, and includes a discontinuity on at least one of the side surfaces. The semiconductor package also includes an encapsulant which covers exposed portions of the package substrate, die and bond wires and side surfaces of the protective cover while leaving the first major cover surface exposed. The discontinuity enhances adhesion of the encapsulant to the protective cover.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a-1p show simplified top and cross-sectional views of various embodiments semiconductor packages;

DETAILED DESCRIPTION

Figure 2A:
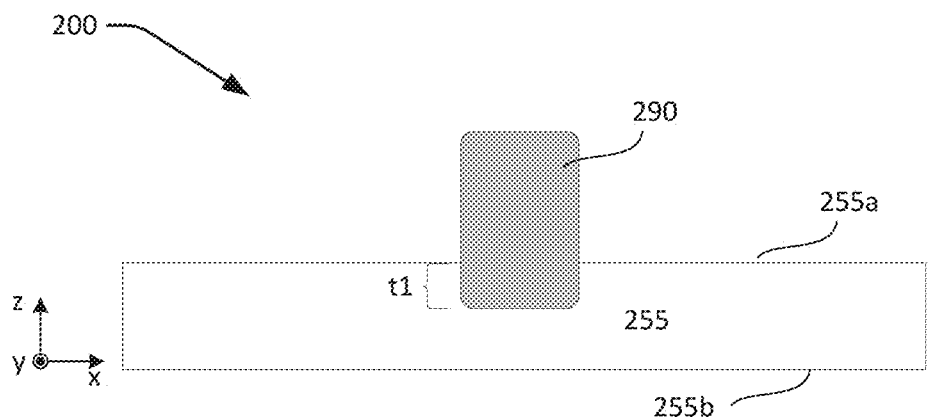
FIGS. 2a-2d show simplified cross-sectional views of an embodiment of a process for forming a cover for a semiconductor package.
Figure 2B:
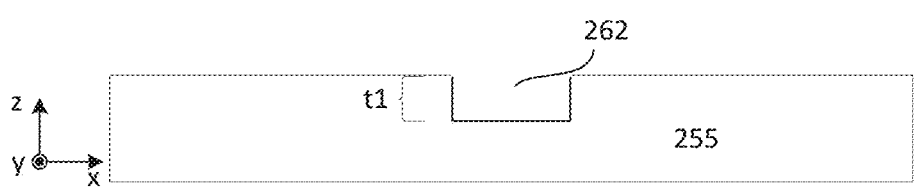
Figure 2C:
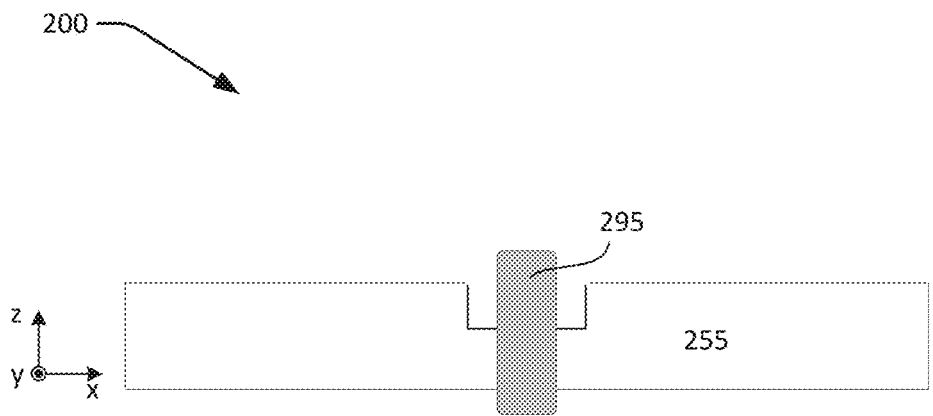
Figure 2D:
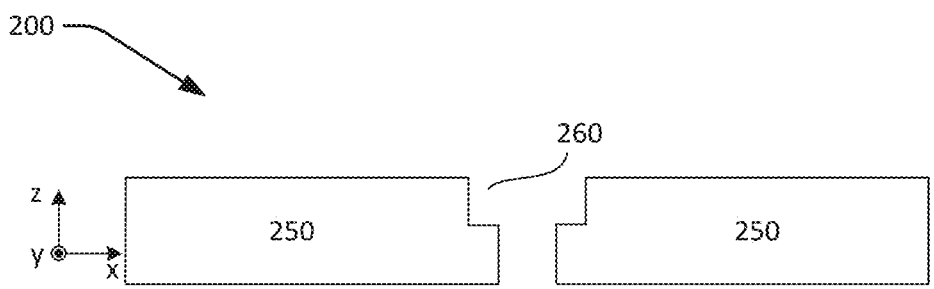

Embodiments described herein generally relate to semiconductor packages and methods for forming a semiconductor package. In some embodiments, the semiconductor package includes a sensor chip used for sensing environmental signals, such as optical signals, audio signals, or the like. The semiconductor package includes a cover over the sensor chip. The semiconductor package may include other types of chips with a cover thereover. The semiconductor package may be incorporated into electronic devices or equipment, such as sensing devices, navigation devices, telecommunication devices, computers and smart devices.

FIG. $1a_i$ and FIG. $1a_{ii}$ to FIG. $1p_i$ and FIG. $1p_{ii}$ show simplified top and cross-sectional views along A-A of various embodiments of semiconductor packages. Figures with the designation i after the alphabet are top views while figures with designation ii after the alphabet are corresponding cross-sectional views along A-A. The various embodiments include common elements. Common elements may not be described or described in detail.

Referring to FIGS. $1a_i$-$1a_{ii}$, an embodiment of a semiconductor package 100a is shown. The semiconductor package 100a includes a package substrate 110 having opposing first and second major surfaces 110a and 110b. The first major surface 110a may be referred to as the top or active substrate surface and the second major surface 110b may be referred to as the bottom substrate surface. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrate, including ceramic and leadframe substrates, may also be useful. It is understood that the package substrate 110 may have various configurations, depending on design requirements.

The top surface of the package substrate may be defined with die and non-die regions 102 and 104. The non-die region 104, for example, surrounds the die region 102. For example, the die region may be centrally disposed within the top surface of the package substrate with the non-die region surrounding it. Providing a die region which is not centrally disposed within the top package surface may also be useful.

The top surface of the package substrate may include package bond pads. In some embodiments, the top surface of the package substrate includes package bond pads disposed outside the die attach region. The bottom package surface may include package contacts. The package contacts, for example, are electrically coupled to the package bond pads of the top surface of the package substrate. For example, each package contact is coupled to its respective package bond pad. The package substrate may include one or more conductive layers embedded therein. The conductive layers may form interconnect structures including conductive traces and contacts for interconnecting the package contacts to package bond pads.

A die 130 is attached to the die region of the top surface of the package substrate. The die, for example, includes first and second opposing major die surfaces 130a and 130b. The first major surface may be referred to as a top or active die surface and the second major surface may be referred to as a bottom or inactive die surface. In one embodiment, the die is a sensor chip. In one embodiment, the die is an image sensor chip. Other types of dies may also be useful. For example, the die may be a thermal or infrared (IR) image sensor chip. Other types of chips, for example non-sensor chips, may also be useful.

The die, as shown, is attached to the die region of the package substrate by a die adhesive 135. The adhesive may be a curable glue or adhesive tape. For example, a curing process may be performed to permanently attach the die to the die region. Other types of die adhesives may also be useful to attach the die to the die region. The bottom surface of the die, for example, is attached to the die region. For example, the inactive die surface is attached to the die region of the package substrate.

In one embodiment, the active die surface includes a sensor region 137. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of chips may also be useful.

The active die surface may include die bond pads disposed outside of the sensor region. For example, the die bond pads may be disposed on the non-sensor region of the active surface of the die. The die bond pads provide external electrical connections to various components of the chip. In one embodiment, bond wires 132 couple the package bond pads to the die bond pads. The bond wires enable external connection to the internal circuitry of the die.

A protective cover 150 is disposed on the die over the sensor region. The protective cover includes first or top and second or bottom opposing cover surfaces with sides or edges. The bottom cover surface, for example, is facing the die. The protective cover, for example, may be a glass cover which enables light to penetrate to the sensor region. Other types of protective covers may also be useful. For example, the cover may depend on the type of sensor.

A cover adhesive 140 may be employed to attach the protective cover on the die. In one embodiment, the top die surface includes a cover adhesive region on which the cover adhesive is disposed. The cover adhesive region, for example, surrounds the sensor region. In one embodiment, a cover adhesive ring is disposed on the adhesive region surrounding the sensor region for attaching the protective cover to the die. The cover adhesive may be a curable adhesive. For example, a curing process may be performed to permanently attach the cover to the die. The curing process, for example, may be performed to permanently attach the die to the die region of the package substrate and the cover to the die.

The protective cover is configured to sufficiently cover the sensor region. Preferably, the protective cover has a rectangular shape which is sufficient to cover the sensor region. Providing a protective cover with other shapes may also be useful. The protective cover forms a vacuum cavity over the sensor region. For example, the protective cover hermetically seals the sensor region.

In one embodiment, as shown, the die bond pads are disposed outside of the adhesive region. For example, the die bond pads are disposed on the top die surface surrounding the protective cover. As such, the bond wires are disposed completely outside of the protective cover. Other configurations of die bond pads and bond wires may also be useful.

An encapsulant 170 is disposed on the package substrate. The encapsulant 170 covers the package substrate, exposed portions of the die and sides of the protective cover 150. For example, the encapsulant is configured to adhere to the sides of the cover while leaving the top of the cover exposed. The encapsulant, for example, may be a mold compound. Other types encapsulants may also be useful.

The protective cover is configured with one or more discontinuities. In one embodiment, one or more side edges of the cover is configured with one or more discontinuities. The discontinuities are configured to improve adhesion with the encapsulant. This reduces or prevents delamination, improving package reliability. A discontinuity may be a continuous discontinuity or discontinuous discontinuities. For example, a continuous discontinuity may be provided continuously on all edges or sides of the cover while a discontinuous discontinuity may be discontinuities distributed on one or more sides of the cover. A continuous discontinuity may also be with respect to an edge of the cover. The term discontinuity may be used to collectively refer to one or more continuous or discontinuous discontinuities.

In one embodiment, as shown in FIGS. $1a_i$-$1a_{ii}$, the discontinuity is a step shape discontinuity. The discontinuity, for example, is a continuous discontinuity disposed on the top surface and top edges of the protective cover. In other words, with respect to the protective cover, the discontinuity is continuous, surrounding all edges of the cover. Other configurations of the discontinuity may also be useful. The discontinuity, for example, may be a discontinuous discontinuity. For example, the continuous steps may be provided on opposing top edges, adjacent top edges, three top edges or even a single top edge, creating an overall discontinuous discontinuity with respect to the cover. However, with respect to a side or an edge of the cover, the discontinuity is a continuous continuity. In other embodiments, the discontinuity with respect to a side of the cover may be discontinuous. For example, the step may be a discontinuous step with respect to a side of the cover. The discontinuity may include continuous and discontinuous discontinuities with respect to different sides of the cover. As already discussed, the discontinuity need not be provided on all sides of the cover.

As shown, the encapsulant 170 covers the sides of the protective cover 150 as well as the step discontinuities 160. The encapsulant, however, leaving the top of the protective cover exposed. For example, the encapsulant is above the bottom of the step discontinuity but below the top surface of the cover. The step enhances adhesion, creating an anchor for the encapsulant. This reduces the risk of delamination of the cover. Furthermore, the step discontinuity decreases the overall thickness of the edges of the cover. This reduces stress on the cover due to thermal expansion which may cause cracks or delamination, further enhancing package reliability.

FIGS. $1b_i$-$1b_{ii}$ show simplified top and cross-sectional views along A-A of another embodiment of a semiconductor package 100b. The package is similar to that described in FIGS. $1a_i$-$1a_{ii}$. However, unlike FIGS. $1a_i$-$1a_{ii}$, the die bond pads are disposed within the cover adhesive region. For example, the cover adhesive 140 covers the die bond pads and portions of the bond wires in the adhesive region. Other configurations of die bond pads and bond wires may also be useful. This advantageously reduces the footprint of the package.

FIGS. $1c_i$-$1c_{ii}$ show simplified top and cross-sectional views along A-A of another embodiment of a semiconductor package 100c. The package is similar to that described in FIGS. $1a_i$-$1a_{ii}$. For example, die bond pads are disposed outside of the cover adhesive region of the top die surface. As such, the bond wires are disposed outside of the protective cover 150.

In one embodiment, the protective cover includes discontinuities on sides of the cover which are recesses 165. For example, recesses are provided on all sides of the cover. A recess may extend from the top to the bottom surfaces of the cover. As shown, each side of the cover includes one recess. However, it is understood each side may include more than one recess. Furthermore, it is also understood that not all sides need to have a recess or recesses nor that the number of recesses for the sides needs to be the same.

A recess, for example, may have a semi-circular profile extending from the top to the bottom of a side of the cover. Other shaped profiles for the recesses may also be useful. It is also understood that recesses need not all have the same shaped profile. Recesses may be formed by a laser drilling process. Forming recesses using other techniques may also be useful. The recesses, for example, increase surface area to improve adhesion of the encapsulant to the cover. In one embodiment, the encapsulant covers the sides of the protective cover but does not extend beyond the top cover surface of the cover. Preferably, the encapsulant covers a major portion of the sides of the cover without extending beyond the top cover surface of the cover.

FIGS. $1d_i$-$1d_{ii}$ show simplified top and cross-sectional views along A-A of another embodiment of a semiconductor package 100d. The package is similar to those described in FIGS. $1a_i$-$1a_{ii}$ to FIGS. $1c_i$-$1c_{ii}$. For example, like FIGS. $1c_i$-$1c_{ii}$, the cover 150 includes recesses 165 on the sides thereof. Furthermore, like FIGS. $1b_i$-$1b_{ii}$, the die bond pads are disposed within the cover adhesive region of the top die surface. As such, the cover adhesive is disposed on the die bond pads and bond wires thereover. As discussed, the recesses improve adhesion of the cover to the encapsulant and providing the die bond pads in the cover adhesive region reduces package size.

FIGS. $1e_i$-$1e_{ii}$ show simplified top and cross-sectional views along A-A of another embodiment of a semiconductor package 100e. The package is similar to those described in FIGS. $1a_i$-$1a_{ii}$ to FIGS. $1d_i$-$1d_{ii}$. For example, like FIGS. $1a_i$-$1a_{ii}$, the die bond pads are disposed outside the cover adhesive region of the top die surface. As such, the bond wires are disposed outside of the protective cover 150.

The protective cover, similar to FIGS. $1a_i$-$1a_{ii}$ to FIGS. $1d_i$-$1d_{ii}$, includes a combination of step and recess discontinuities 160 and 165. As discussed, although it is preferable that the step and recess discontinuities are provided on all sides of the cover, it is not necessary. Furthermore, the step discontinuities need not be continuous nor do the recess discontinuities need to be provided with the same number for each side. Providing a combination of both step and recess discontinuities further enhances adhesion of the cover to the encapsulant.

Referring to FIGS. $1f_i$-$1f_{ii}$, simplified top and cross-sectional views along A-A of another embodiment of a semiconductor package 100f are shown. The package is similar to those described in FIGS. $1a_i$-$1a_{ii}$ to FIGS. $1e_i$-$1e_{ii}$. For example, like FIGS. $1b_i$-$1b_{ii}$, the die bond pads are disposed within the cover adhesive region of the top die surface. As such, the cover adhesive is disposed on the die bond pads and bond wires thereover. As for the protective cover, it is similar to that described in FIGS. $1e_i$-$1e_{ii}$, which includes a combination of step and recess discontinuities. As discussed, the recesses and steps improve adhesion of the cover to the encapsulant and providing the die bond pads in the cover adhesive region reduces package size.

FIGS. $1g_i$-$1g_{ii}$ show simplified top and cross-sectional views along A-A of another embodiment of a semiconductor package 100g. The package is similar to those described in FIGS. $1a_i$-$1a_{ii}$ to FIGS. $1f_i$-$1f_{ii}$. For example, like FIGS. $1a_i$-$1a_{ii}$, the die bond pads are disposed outside the cover adhesive region of the top die surface. As such, the bond wires are disposed outside of the protective cover. As for the protective cover, it includes step discontinuities, similar to FIGS. $1a_i$-$1a_{ii}$. However, unlike the step discontinuities of FIG. $1a_i$-$1a_{ii}$, they are disposed on the bottom edge of the cover. Providing the step discontinuity on the bottom surface of the cover advantageously provides additional clearance for the wire bonds, facilitating a reduction in die package size while enhancing adhesion of the cover to the encapsulant.

FIGS. $1h_i$-$1h_{ii}$ show simplified top and cross-sectional views along A-A of another embodiment of a semiconductor package 100h. The package is similar to those described in FIGS. $1a_i$-$1a_{ii}$ to FIGS. $1g_i$-$1g_{ii}$. For example, like FIGS. $1h_i$-$1h_{ii}$, the cover includes step discontinuities disposed on a bottom surface thereof. However, unlike FIGS. $1h_i$-$1h_{ii}$, the die bond pads are disposed within the cover adhesive region of the top die surface. As such, the cover adhesive covers the die bond pads and portions of the bond wires thereon. Providing the step discontinuity on the bottom surface of the cover and die bond pads on the adhesive region further facilitates reducing package size while enhancing adhesion of the cover to the encapsulant.

FIGS. $1i_i$-$1i_{ii}$ show simplified top and cross-sectional views along A-A of another embodiment of a semiconductor package 100i. The package is similar to those described in FIGS. $1a_i$-$1a_{ii}$ to FIGS. $1h_i$-$1h_{ii}$. For example, like FIGS. $1a_i$-$1a_{ii}$, the die bond pads are disposed outside the cover adhesive region of the top die surface. As such, the bond wires are disposed outside of the protective cover.

As for the protective cover, it includes bevel discontinuities 168. The bevel discontinuities may be angled at 45°. Providing bevels at other angles may also be useful. For example, having bevel discontinuities angled in the range of about 45°-60° may also be useful. The bevel discontinuity is provided on the top cover surface. The bevel discontinuity, similar to the step discontinuity, need not be provided on all sides nor do they need to be continuous within a side of the cover. The encapsulant extends above the beginning of the discontinuity, but not beyond a top surface of the cover. The bevel discontinuity improves adhesion of the cover to the encapsulant, improving package reliability.

FIGS. $1j_i$-$1j_{ii}$ show simplified top and cross-sectional views along A-A of another embodiment of a semiconductor package 100j. The package is similar to those described in FIGS. $1a_i$-$1a_{ii}$ to FIGS. $1i_i$-$1i_{ii}$. For example, like FIGS. $1b_i$-$1b_{ii}$, the die bond pads are disposed within the cover adhesive region of the top die surface. As such, the cover adhesive covers the die bond pads and portions of the bond wires disposed thereon. As for the protective cover, it includes bevel discontinuities 168 as described in FIGS. $1i_i$-$1i_{ii}$. The bevel discontinuity improves adhesion of the cover to the encapsulant while providing die bond pads within the cover adhesion region reduces package size.

FIGS. $1k_i$-$1k_{ii}$ show simplified top and cross-sectional views along A-A of another embodiment of a semiconductor package 100k. The package is similar to those described in FIGS. $1a_i$-$1a_{ii}$ to FIGS. $1j_i$-$1j_{ii}$. For example, like FIGS. $1a_i$-$1a_{ii}$, the die bond pads are disposed outside the cover adhesive region of the top die surface. As such, the bond wires are disposed outside of the protective cover. As for the protective cover, it includes bevel discontinuities 168 and recess discontinuities 165. The combination of bevel and recess discontinuities further enhances adhesion of the cover to the encapsulant, improving package reliability.

FIGS. $1l_i$-$1l_{ii}$ show simplified top and cross-sectional views along A-A of another embodiment of a semiconductor package 100l. The package is similar to those described in FIGS. $1a_i$-$1a_{ii}$ to FIGS. $1k_i$-$1k_{ii}$. For example, like FIGS. $1b_i$-$1b_{ii}$, the die bond pads are disposed within the cover adhesive region of the top die surface. As such, the cover adhesive covers the die bond pads and portions of the bond wires disposed thereon. As for the protective cover, it includes a combination of bevel discontinuities 168 and recess discontinuities 165. The bevel and recess discontinuities improve adhesion of the cover to the encapsulant while providing die bond pads within the cover adhesion region reduces package size.

FIGS. $1m_i$-$1m_{ii}$ show simplified top and cross-sectional views along A-A of another embodiment of a semiconductor package 100m. The package is similar to those described in FIGS. $1a_i$-$1a_{ii}$ to FIGS. $1l_i$-$1l_{ii}$. For example, like FIGS. $1a_i$-$1a_{ii}$, the die bond pads are disposed outside the cover adhesive region of the top die surface. As such, the bond wires are disposed outside of the protective cover. As for the protective cover, it includes partial recess discontinuities 166. The partial recess discontinuities, for example, extend partially from the top cover surface. Like the recesses previously described, they need not be on all sides of the cover nor do they need to have the same number of recesses per side. In addition, the recesses need not extend to the same depth. The partial recess discontinuities enhance adhesion of the cover to the encapsulant, improving package reliability.

FIGS. $1n_i$-$1n_{ii}$ show simplified top and cross-sectional views along A-A of another embodiment of a semiconductor package 100n. The package is similar to those described in FIGS. $1a_i$-$1a_{ii}$ to FIGS. $1m_i$-$1m_{ii}$. For example, like FIGS. $1b_i$-$1b_{ii}$, the die bond pads are disposed within the cover adhesive region of the top die surface. As such, the cover adhesive covers the die bond pads and portions of the bond wires disposed thereon. As for the protective cover, it includes a combination of bevel discontinuities 168 and recess discontinuities 165. The partial recess discontinuities improve adhesion of the cover to the encapsulant while providing die bond pads within the cover adhesion region reduces package size.

FIGS. $1o_i$-$1o_{ii}$ show simplified top and cross-sectional views along A-A of another embodiment of a semiconductor package 100o. The package is similar to those described in FIGS. $1a_i$-$1a_{ii}$ to FIGS. $1n_i$-$1n_{ii}$. For example, like FIGS. $1a_i$-$1a_{ii}$, the die bond pads are disposed outside the cover adhesive region of the top die surface. As such, the bond wires are disposed outside of the protective cover. As for the protective cover, it includes partial recess discontinuities 166. The partial recess discontinuities, for example, extend partially from the bottom cover surface. Similar to the partial recesses of FIGS. $1m_i$-$1m_{ii}$ to FIGS. $1n_i$-$1n_{ii}$, they need not be on all sides of the cover nor do they need to have the same number of recesses per side. In addition, the recesses need not extend to the same depth. The partial recess discontinuities enhance adhesion of the cover to the encapsulant, improving package reliability.

FIGS. $1p_i$-$1p_{ii}$ show simplified top and cross-sectional views along A-A of another embodiment of a semiconductor package $100p$. The package is similar to those described in FIGS. $1a_i$-$1a_{ii}$ to FIGS. $1o_i$-$1o_{ii}$. For example, like FIGS. $1b_i$-$1b_{ii}$, the die bond pads are disposed within the cover adhesive region of the top die surface. As such, the cover adhesive covers the die bond pads and portions of the bond wires disposed thereon. As for the protective cover, it includes partial recess discontinuities 166 and recess extending from the bottom cover surface. The partial recess discontinuities improve adhesion of the cover to the encapsulant while the die bond pads within the cover adhesion region reduce package size.

As described, the covers are provided with discontinuities to enhance adhesion of the cover to the encapsulant to improve package reliability. The discontinuities may have different configurations, such as step discontinuities, recess discontinuities, partial recess discontinuities, and bevel discontinuities. Other types of discontinuities may also be useful. The discontinuities may be provided on the top edge, bottom edge or sides of the protective cover. The discontinuities may be configured as a continuos or discontinuous discontinuities. Furthermore, the discontinuities may be configured as a combination of discontinuities, such as different types of discontinuities and on different parts of the cover. Just as examples, the cover may include step discontinuities on both top and bottom edges, whether continuous or not as well as with or without recess discontinuities and/or partial recess discontinuities. Another arrangement of discontinuities may include a step discontinuity on one surface while a bevel discontinuity on the other surface, continuous or discontinuous and with or without recess and/or partial recess discontinuities.

FIGS. $2a$-$2d$ show cross-sectional views of an embodiment of a process 200 for forming a cover for a semiconductor package. The semiconductor package is, for example, same or similar to those described in FIGS. $1a_i$-$1a_{ii}$ to FIGS. $1p_i$-$1p_{ii}$. For example, the cover is attached to a die, such as a sensor die, of a semiconductor package having a semiconductor chip mounted on a package substrate. Common elements and features may not be described or described in detail.

Referring to FIG. $2a$, the process includes providing a cover substrate 255. The cover substrate, for example, is employed to form a plurality of protective covers with a discontinuity or discontinuities. The cover substrate, for example, is a glass sheet used in forming a plurality of covers. Other types of cover substrates may also be useful. As shown, the cover substrate includes opposing top and bottom cover substrate surfaces 255a and 255b. Typically the cover substrate may have a dimension of about 125×125 mm$^2$, having a thickness from about 0.4 mm to about 0.5 mm.

In one embodiment, the cover substrate is processed to form a plurality of protective covers having step discontinuities, such as in FIGS. $1a_i$-$1a_{ii}$. In one embodiment, the process includes forming step cuts into the substrate using a saw 290. The saw, for example, is a rotary saw used in singulating the cover substrate into a plurality of covers. Other techniques for forming the discontinuities may also be useful. For example, scribing or laser cutting may also be employed to form the discontinuities. The blade of the saw, for example, has a width sufficient to create a step for two adjacent covers. For example, the width of the saw blade used to form the step discontinuities (step saw blade) may be about 5 um. Other widths may also be useful.

The saw is configured to perform a plurality of cuts along first (x) and second (y) directions which are perpendicular to each other along a plane of the cover substrate. The cuts, in one embodiment, are performed along the dicing lines or cutting lines for singulating the cover substrates into a plurality of protective covers. In one embodiment, the cuts are performed to create a discontinuity depth t1. For example, t1 may be about 50% of the thickness of a cover substrate for the cover substrate having a thickness of less than about 1 mm. Other discontinuity depths that are less than a thickness of the cover substrate may also be useful. For example, t1 may be less than half the thickness of the cover substrate. The discontinuity depth should be selected to achieve the desired effect of the discontinuities without sacrificing mechanical stability. The cuts, for example, are performed on one of the major surfaces of the substrate, such as the first major surface 255a. It is understood that the different cuts may be performed at different depths or t1s. However, the depths of the different cuts should not exceed the upper limit of t1.

As shown in FIG. $2b$, the process creates a plurality of steps or trenches 262 having a depth t1 and a width equal to the width of the saw blade. In the case the cuts create steps on the top surface of the protective covers which are continuous on all sides, the cuts are performed as continuous cuts along the dicing lines. In the case the cuts are intended to create discontinuous steps along all four sides, intermittent cuts are made along the dicing lines. A combination of intermittent and continuous cuts can be performed to provide continuous and discontinuous steps for different sides. To provide sides without discontinuities, cuts may not be performed on respective dicing lines. For the case in which steps are provided on both surfaces of the protective covers, cuts are performed on both surfaces of the cover substrate. As already discussed, the different cuts may be performed at different depths or t1s. Furthermore, an intermittent cut may be performed with different depths as well. However, the depths of the different cuts should not exceed the upper limit of t1.

Continuous steps, discontinuous steps or a combination thereof may be formed on both sides of the protective covers. Furthermore, not all sides need to include discontinuities. When steps are formed on both surfaces, the depth of the steps may be smaller than in the case where steps are formed on only one of the major surfaces. For example, the upper limit of t1 of the cuts for both surfaces may be about ½ of that for the case in which discontinuities are formed only on one surface. Furthermore, as already discussed, the depths of cuts for the different cuts within a surface or on different surfaces need not be the same.

In FIG. $2c$, the cover substrate is cut along the dicing lines in the x and y directions using a singulation blade 295. The width of the singulation blade is less than the step blade of FIG. $2a$. The cuts, for example, are performed completely through the surfaces of the cover substrate to singulate the cover substrate into individual protective covers 250 with step discontinuities 260, as shown in FIG. $2d$. The protective covers are then used in forming the semiconductor packages.

FIGS. $3a$-$3d$ show cross-sectional views of another embodiment of a process 300 for forming a cover for a semiconductor package. The process is similar to that described in FIGS. 2a-2d. Common elements and features may not be described or described in detail. The semiconductor package is, for example, same or similar to those described in FIGS. $1a_i$-$1d_{ii}$ to FIGS. $1p_i$-$1p_{ii}$. For example, the cover is attached to a die, such as a sensor die, of a semiconductor package having a semiconductor chip mounted on a package substrate.

Figure 3A:
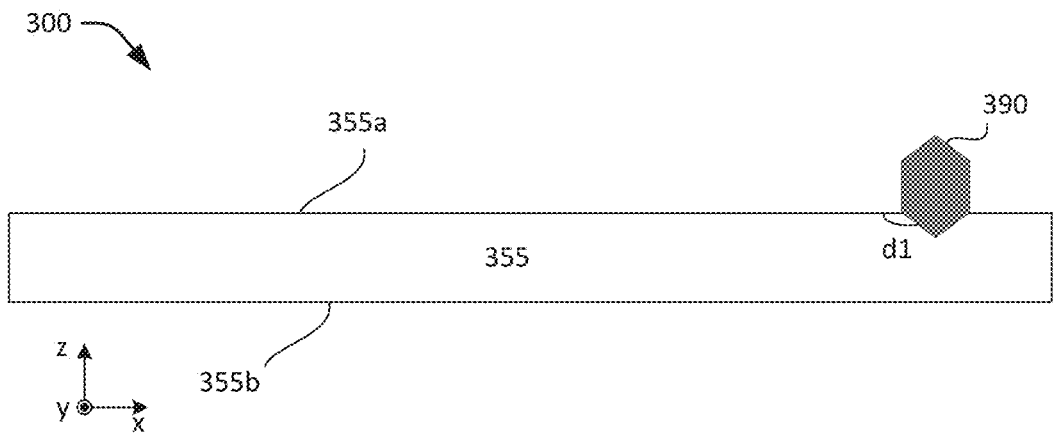
FIGS. 3a-3d show simplified cross-sectional views of another embodiment of a process for forming a cover for a semiconductor package.
Figure 3B:
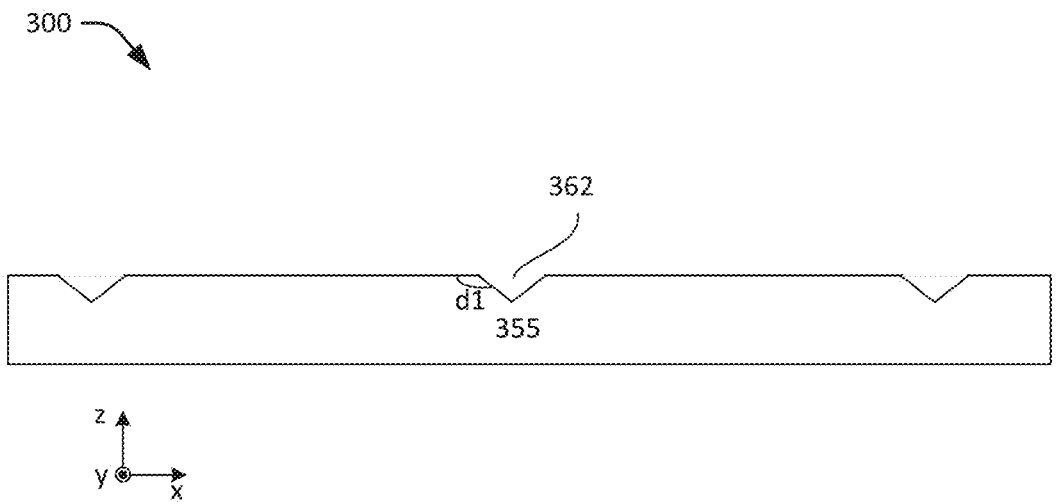

As shown in FIG. 3a, the process includes providing a cover substrate 355, such as a glass sheet having a dimension of about 125×125 mm² and a thickness ranging from about 0.4 to about 0.5 mm. Other types of cover substrates or cover substrates with other dimensions or thicknesses may also be useful. As shown, the cover substrate includes opposing top and bottom cover substrate surfaces 355a and 355b.

In one embodiment, the cover substrate is processed to form a plurality of protective covers having bevel discontinuities, such in FIGS. $1i_i$-$1i_{ii}$. The bevel discontinuities are formed by cutting the substrate with a bevel shaped saw blade 390. The saw, for example, is a rotary saw used in singulating the cover substrate into a plurality of covers. Other techniques for forming the discontinuities may also be useful. For example, scribing or laser cutting may also be employed to form the discontinuities. The blade of the saw, for example, has a width sufficient to create a bevel discontinuity for two adjacent covers. For example, the width of the saw blade used to form the bevel discontinuities (bevel saw blade) may be about 0.5 mm. Other widths may also be useful. Furthermore, the bevel saw blade is configured to form bevel discontinuities 362 having an angle d1. The angle d1, for example, may range from about 120° to about 135°. Other angles d1 may also be useful.

Continuous steps, discontinuous steps or a combination thereof may be formed on both sides of the protective covers. Furthermore, not all sides need to include discontinuities. In addition, it is understood that the discontinuities on the top and bottom surfaces may be different types of discontinuities. For example, one surface may include bevel discontinuities while the other surface may include step discontinuities. In addition, the discontinuities within one surface may be different. For example, discontinuities may alternate between step and bevel discontinuities. The discontinuities may be discontinuous, continuous or a combination thereof within a surface or for different surfaces.

Figure 3C:
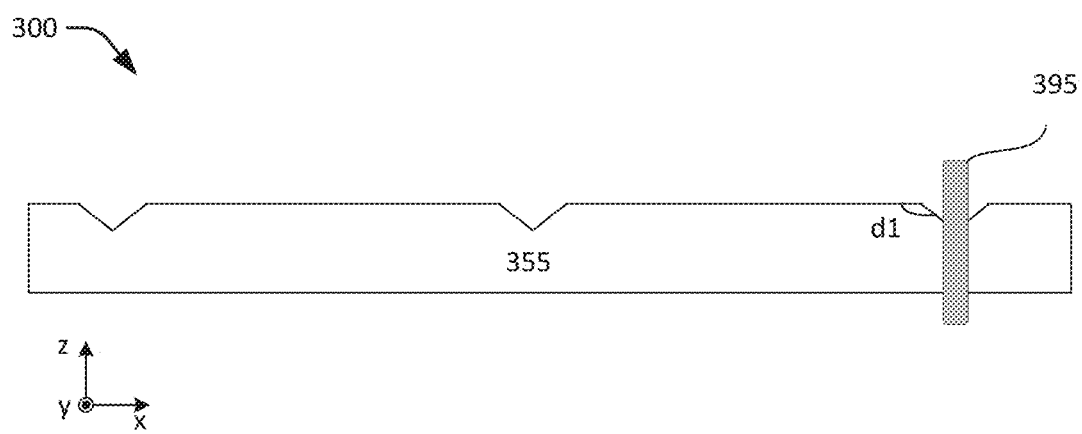
Figure 3D:
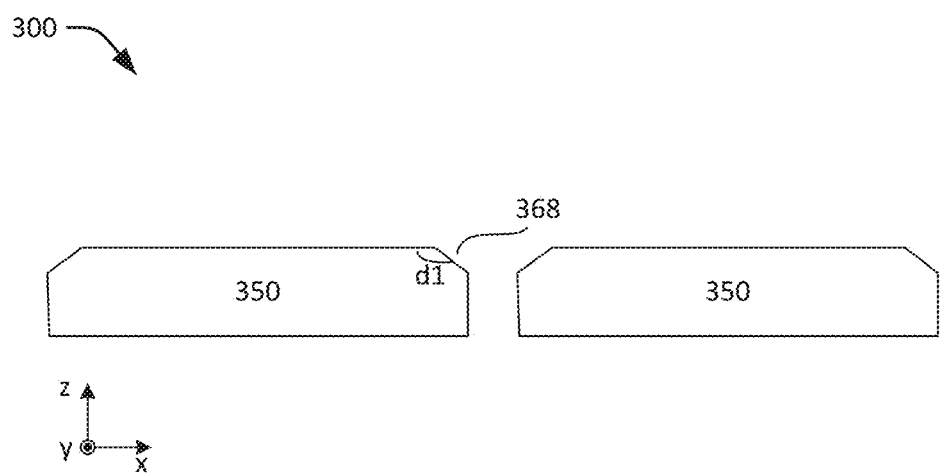

In FIG. 3c, the cover substrate 355 is cut along the dicing lines in the x and y directions using a singulation blade 395. The width of the singulation blade is less than the bevel blade of FIG. 3a. The cuts, for example, are performed completely through the surfaces of the cover substrate to singulate the cover substrate into individual protective covers 350 with bevel discontinuities 368, as shown in FIG. 3d. The protective covers are then used in forming the semiconductor packages.

Figure 4:
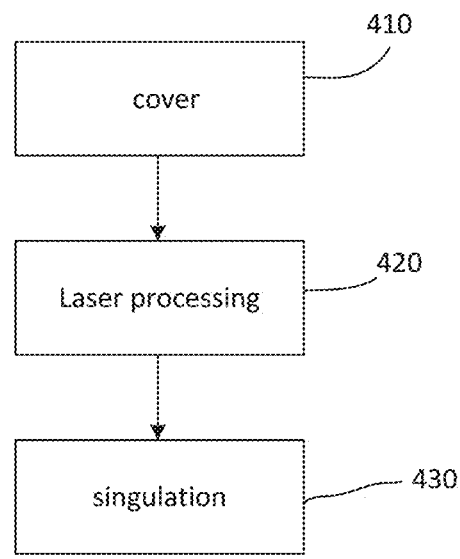
FIG. 4 shows a process flow for forming another embodiment of a cover for a semiconductor package.

FIG. 4 shows a process flow 400 of forming another embodiment of a cover for a semiconductor package. The process may be similar to those described in FIGS. 2a-2d and FIGS. 3a-d. Common elements and features may not be described or described in detail. The semiconductor package is, for example, same or similar to those described in FIGS. $1a_i$-$1a_{ii}$ to FIGS. $1p_i$-$1p_{ii}$. For example, the cover is attached to a die, such as a sensor die, of a semiconductor package having a semiconductor chip mounted on a package substrate.

The process includes providing a cover substrate at 410, such as a glass sheet having a dimension of about 125×125 mm² and a thickness ranging from about 0.4 mm to about 0.5 mm. Other types of cover substrates or cover substrates with other dimensions or thicknesses may also be useful. The cover substrate includes opposing top and bottom cover substrate surfaces.

In one embodiment, the cover substrate is processed to form a plurality of protective covers having recess discontinuities, as described in FIGS. $1c_i$-$1c_{ii}$. The recess discontinuities are formed by laser drilling or cutting at 420. For example, a laser drill is used to form laser recess discontinuities in the cover substrate. Other techniques for forming recess discontinuities may also be useful.

Recess discontinuities, in one embodiment, are formed along the dicing lines in the x and y directions. The recess discontinuities, for example, are openings along the dicing lines in the x and y directions. The recess discontinuities may be openings completely through the cover substrate. Providing recess discontinuities partially through the cover substrate from one major surface may also be useful to form partial recess discontinuities, as described in, for example, FIGS. $1m_i$-$1m_{ii}$. In addition, the forming of the recess discontinuities can be combined with forming step discontinuities, bevel discontinuities or a combination thereof on one or both surfaces, whether continuous or discontinuous or a combination thereof, as previously described.

At 430, the cover substrate is cut along the dicing lines in the x and y directions using a singulation blade. The cuts, for example, are performed completely through the surfaces of the cover substrate to singulate the cover substrate into individual protective covers 350 with discontinuities. The protective covers are then used in forming the semiconductor packages.

Figure 5:
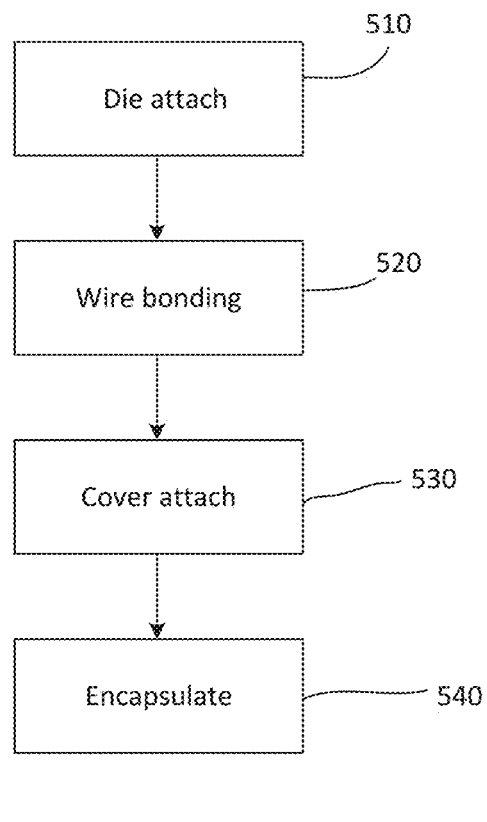
FIG. 5 shows a process flow for forming an embodiment of a semiconductor package.

FIG. 5 shows a process flow 500 for an embodiment of forming a semiconductor package. The package, for example, is similar to those described in FIGS. $1a_i$-$1a_{ii}$ to FIGS. $1p_i$-$1p_{ii}$, FIGS. 2a-d, FIGS. 3a-d and FIG. 4. Common elements may not be described or described in detail.

The process flow, for example, commences as 510. For example, the process flow, as shown, is at a stage where dies are formed on a wafer and diced to form individual dies, and protective covers are formed using a cover substrate and diced to form individual covers. The process includes providing a package substrate. The package substrate may include top and bottom major surfaces. The top surface of the package substrate may include a die attach region and package bond pads disposed outside of the die attach region. The bottom surface of the package substrate may include package contacts which are interconnected to the package bond pads on the opposing surface, for example, by one or more metal layers and via contacts embedded in the package substrate.

A die is attached to the die attach region, for example, by an adhesive. The adhesive may be an adhesive tape disposed on the die attach region. The die, for example, is temporarily attached to the die attach region. For example, a curing process may be performed to permanently attach the die to the die region.

The process, in one embodiment, forms wire bonds at 520. The wire bonds connect the die pads on the top surface of the die to package bond pads on the top surface of the package substrate.

A protective cover is attached to the die at 530. The protective cover, for example, is a glass cover. Other types of protective cover may also be useful. An adhesive is applied onto the cover adhesive region on the die. The adhesive, for example, may be a UV-curable adhesive. Other types of adhesives may also be useful. The adhesive may be applied by dispensing. Other techniques for applying the adhesive may also be useful.

The cover adhesive region, for example, surrounds the sensor region of the die. The cover adhesive region, in one embodiment, is disposed between die bond pads and the sensor region. In other cases, the die bond pads are disposed within the cover adhesive region. In such cases, the adhesive is disposed on the die bond pads and portions of the bonding wire thereover. For embodiments having die bond pads outside of the adhesive region, 520 and 530 are interchangeable. The protective cover is placed on the adhesive and the package is cured to permanently attach the cover to the die. The protective cover includes discontinuities, as discussed. Curing processes like UV curing and thermal curing may be performed to permanently attaching the protective cover to the die.

An encapsulant, such as epoxy, is formed over the package substrate. The encapsulant covers the package substrate, exposed portions of the die and wire bonds, and sides of the protective cover. The epoxy may be formed by, for example, dispensing. Other techniques or materials may also be employed for the encapsulant. The encapsulant is cured thereafter.

Typically, the package substrate may include a leadframe with multiple package substrates. For example, the package substrates of the leadframe may be arranged in a matrix format, with rows and columns of package substrates. This facilitates parallel processing. For example, a plurality of dies are attached to the package substrates. After processing is completed, the leadframe is singulated, separating it into individual packages.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
   a package substrate having top and bottom major package substrate surfaces, the top major package surface includes a die attach region;
   a die disposed on the die attach region, wherein the die includes first and second major die surfaces, the second major die surface is attached to the die attach region, the first major die surface includes a die active region;
   a cover adhesive disposed on the first major die surface surrounding the die active region;
   a protective cover having first and second major cover surfaces and side surfaces, wherein the second major cover surface is attached to the die by the cover adhesive, the protective cover covers the die active region, wherein the protective cover includes a discontinuity on at least one of the side surfaces; and
   an encapsulant, the encapsulate covers exposed portions of the package substrate, die and bond wires and side surfaces of the protective cover while leaving the first major cover surface exposed, wherein the discontinuity enhances adhesion of the encapsulant to the protective cover.

2. The semiconductor package in claim 1 wherein the discontinuity is a continuous discontinuity on all the side surfaces of the protective cover.

3. The semiconductor package in claim 1 wherein the discontinuity is a discontinuous discontinuity distributed on at least one of the side surfaces of the protective cover.

4. The semiconductor package in claim 1 wherein the discontinuity includes a step discontinuity, a recess discontinuity, a bevel discontinuity, or a combination thereof on at least one of the side surfaces of the protective cover.

5. The semiconductor package in claim 1 wherein the die comprises a plurality of die bond pads disposed on the first major die surface under the cover adhesive.

6. The semiconductor package in claim 1 wherein the die comprises a plurality of die bond pads disposed on the first major die surface outside the cover adhesive.

7. The semiconductor package in claim 4 wherein the step discontinuity is a continuous step discontinuity disposed on all edges of one of the major cover surfaces of the protective cover.

8. The semiconductor package in claim 4 wherein the step discontinuity includes a discontinuous step discontinuity disposed on an edge of one of the major cover surfaces of the protective cover.

9. The semiconductor package in claim 4 wherein the step discontinuity includes a continuous step discontinuity disposed on an edge of one of the major cover surfaces of the protective cover.

10. The semiconductor package in claim 4 wherein the step discontinuity includes a discontinuous step discontinuity, a continuous step discontinuity, or a combination thereof on edges of one of the major cover surfaces of the protective cover.

11. The semiconductor package in claim 4 wherein the recess discontinuity includes a recess extending from at least one of the major cover surfaces of the protective cover.

12. The semiconductor package in claim 11 wherein the recess discontinuity includes a recess extending from the first major cover surface to the second major cover surface of the protective cover.

13. The semiconductor package in claim 11 wherein the recess discontinuity includes a recess extending partially from one of the major cover surfaces of the protective cover.

14. The semiconductor package in claim 11 wherein the recess includes a plurality of recesses disposed on all the side surfaces of the protective cover.

15. The semiconductor package in claim 11 wherein the recess includes a plurality of recesses disposed on at least one of the side surfaces of the protective cover.

16. The semiconductor package in claim 4 wherein the bevel discontinuity includes a continuous bevel discontinuity disposed on all edges of one of the major cover surfaces of the protective cover.

17. The semiconductor package in claim 4 wherein the bevel discontinuity includes a discontinuous bevel discontinuity disposed on an edge of one of the major cover surfaces of the protective cover.

18. The semiconductor package in claim 4 wherein the bevel discontinuity includes a continuous bevel discontinuity disposed on an edge of one of the major cover surfaces of the protective cover.

19. The semiconductor package in claim 4 wherein the bevel discontinuity includes a discontinuous bevel discontinuity, a continuous bevel discontinuity, or a combination thereof on edges of one of the major cover surfaces of the protective cover.

20. The semiconductor package in claim 4 wherein the bevel discontinuity includes a bevel angled in a range of about 45°-60°.

* * * * *